(12) United States Patent
Nakagawa et al.

(10) Patent No.: US 6,756,289 B1
(45) Date of Patent: Jun. 29, 2004

(54) METHOD OF PRODUCING SEMICONDUCTOR MEMBER AND METHOD OF PRODUCING SOLAR CELL

(75) Inventors: Katsumi Nakagawa, Nara (JP); Takao Yonehara, Atsugi (JP); Shoji Nishida, Fujisawa (JP); Kiyofumi Sakaguchi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 335 days.

(21) Appl. No.: 09/638,398

(22) Filed: Aug. 15, 2000

Related U.S. Application Data

(62) Division of application No. 08/999,132, filed on Dec. 29, 1997, now Pat. No. 6,190,937.

(30) Foreign Application Priority Data

Dec. 27, 1996 (JP) .............................................. 8-350132
Dec. 27, 1996 (JP) .............................................. 8-350133

(51) Int. Cl.$^7$ .............................................. H01L 21/46
(52) U.S. Cl. ........................ 438/478; 438/459; 438/464; 438/977
(58) Field of Search ................................. 438/478, 459, 438/464, 977, 745

(56) References Cited

U.S. PATENT DOCUMENTS

| | | | |
|---|---|---|---|
| 3,933,539 A | * | 1/1976 | Gartman ...................... 117/201 |
| 4,058,418 A | | 11/1977 | Lindmayer ................... 148/175 |
| 4,236,947 A | * | 12/1980 | Baliga .......................... 148/171 |
| 4,774,194 A | | 9/1988 | Hokuyou ........................ 437/5 |
| 4,778,478 A | | 10/1988 | Barnett ............................ 437/5 |
| 4,816,420 A | | 3/1989 | Bozler et al. ................... 437/2 |
| 4,900,694 A | | 2/1990 | Nakagawa ................... 437/109 |

(List continued on next page.)

FOREIGN PATENT DOCUMENTS

| | | |
|---|---|---|
| CN | 1056940 C | 6/1992 |
| EP | 0 272 636 | 6/1988 |
| EP | 0 688 048 | 12/1995 |
| EP | 0 703 609 | 3/1996 |
| JP | 5-21338 | 1/1993 |
| JP | 5-211128 | 8/1993 |
| JP | 6-45622 | 2/1994 |
| JP | 6-191987 | 7/1994 |
| JP | 7-302889 | 11/1995 |
| JP | 8-97389 | 4/1996 |
| JP | 8-213645 | 8/1996 |
| WO | 81/02948 | 10/1981 |

OTHER PUBLICATIONS

H. Baumgart, et al., "Dielectric Isolation Using Porous Silicon", Mat. Res. Soc. Symp. Proc., vol. 33, pp. 63–68 (1994).
Nikkei Microdevices, pp. 76–77 (1994).
P. Schmuki, et al., "Initiation and Formation of Porous GaAs", J. Electrochem. Soc., vol. 143, No. 10, pp. 3316–3322 (1996).

(List continued on next page.)

Primary Examiner—Savitri Mulpuri
(74) Attorney, Agent, or Firm—Fitzpatrick, Cella, Harper & Scinto

(57) ABSTRACT

To accomplish both of higher performance of a crystal and lower cost in a semiconductor member, and to produce a solar cell having a high efficiency and a flexible shape at low cost, the semiconductor member is produced by the following steps, (a) forming a porous layer in the surface region of a substrate, (b) immersing the porous layer into a melting solution in which elements for forming a semiconductor layer to be grown is dissolved, under a reducing atmosphere at a high temperature, to grow a crystal semiconductor layer on the surface of the porous layer, (c) bonding another substrate onto the surface of the substrate on which the porous layer and the semiconductor layer are formed and (d) separating the substrate from the another substrate at the porous layer.

26 Claims, 10 Drawing Sheets

U.S. PATENT DOCUMENTS

| | | | |
|---|---|---|---|
| 5,277,748 A | 1/1994 | Sakaguchi et al. | 156/630 |
| 5,371,037 A | 12/1994 | Yonehara | 437/86 |
| 5,374,564 A | 12/1994 | Bruel | 437/24 |
| 5,391,257 A | 2/1995 | Sullivan et al. | 156/630 |
| 5,492,859 A | 2/1996 | Sakaguchi et al. | 437/86 |
| 5,536,361 A | 7/1996 | Kondo et al. | 156/630.1 |
| 5,811,348 A | 9/1998 | Matsushita et al. | 438/455 |
| 5,840,616 A | 11/1998 | Sakaguchi et al. | 438/459 |
| 5,856,229 A | 1/1999 | Sakaguchi et al. | 438/406 |
| 5,966,620 A | 10/1999 | Sakaguchi et al. | 438/455 |

OTHER PUBLICATIONS

T. Unagami, "Formation M chanism of Porous Silicon Layer by Anodization in HF Solution", J. Electroch m. Soc., vol. 127, No. 2, pp. 476–483 (1980).

R.P. Holmstrom, et al., "Compl te di l ctric isolation by highly selective and self–stopping formation of oxidized porous silicon", Appl. Phys. Lett., vol. 42, No. 4, pp. 386–388 (1983).

A.G. Miln s, et al., "Peel d Film Technol gy for Solar C lls", 11th IEEE Photovoltaic Spec. Conf., Scottsdal, Arizona, pp. 338–341 (1975).

* cited by examiner

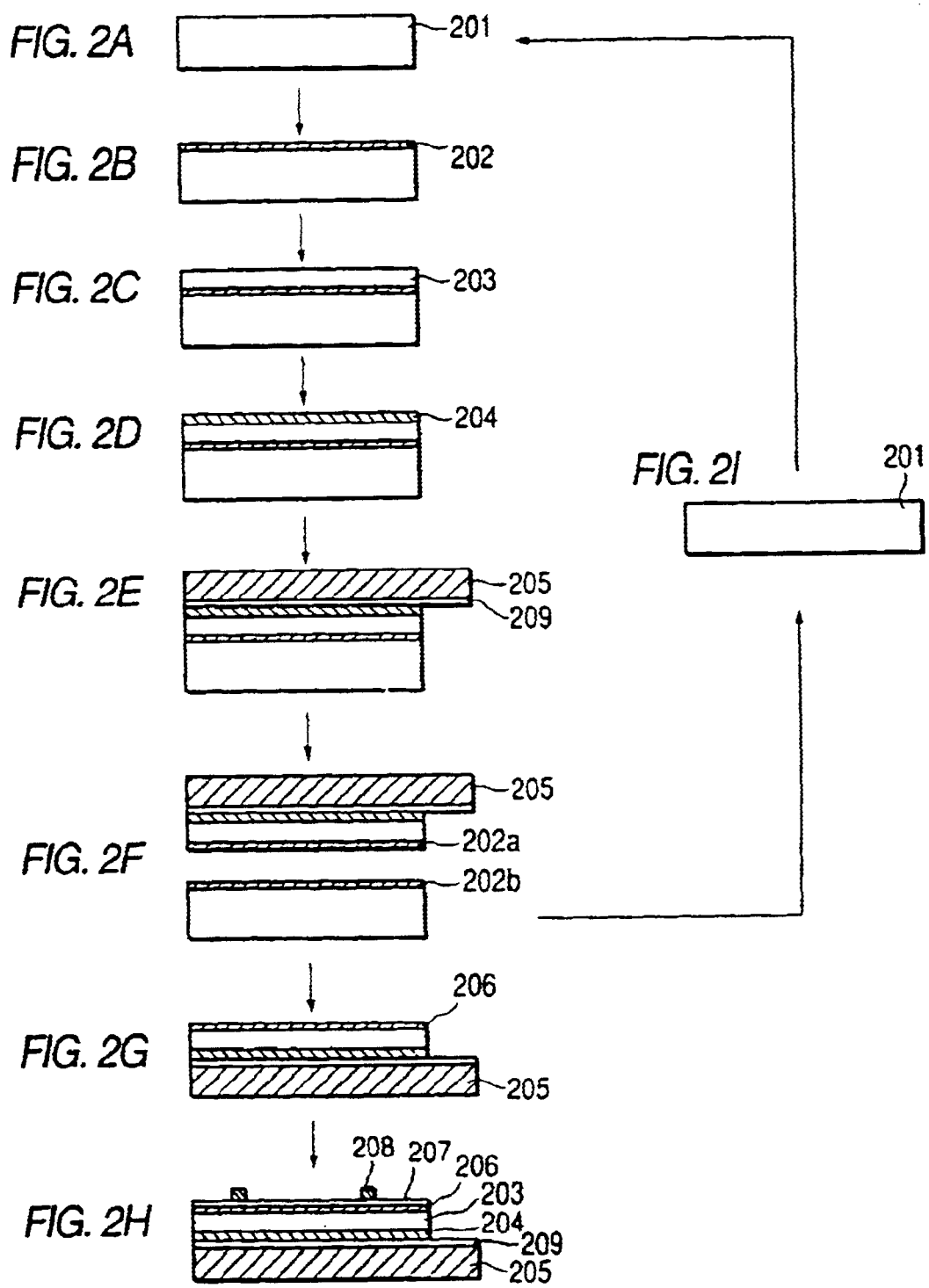

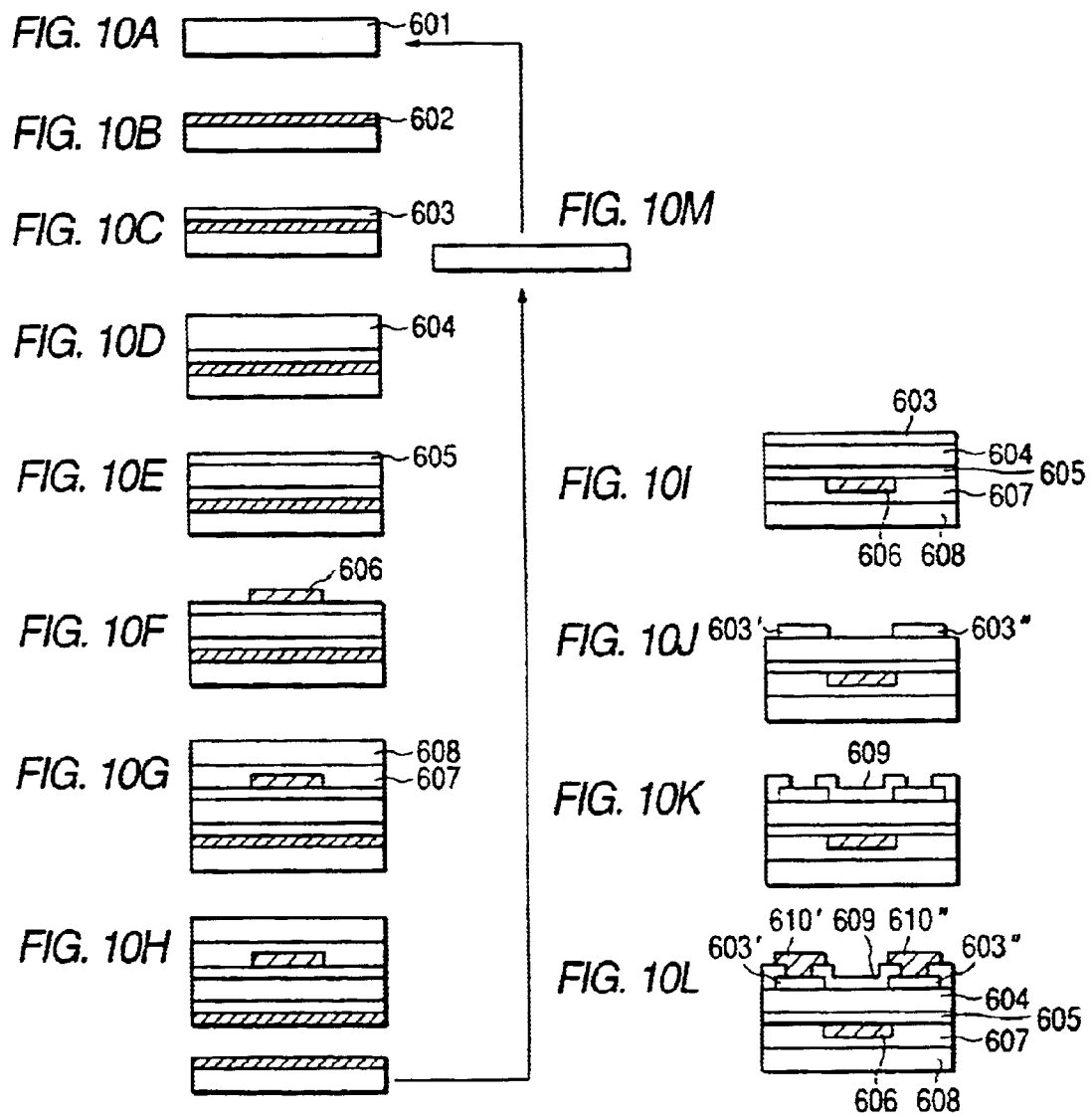

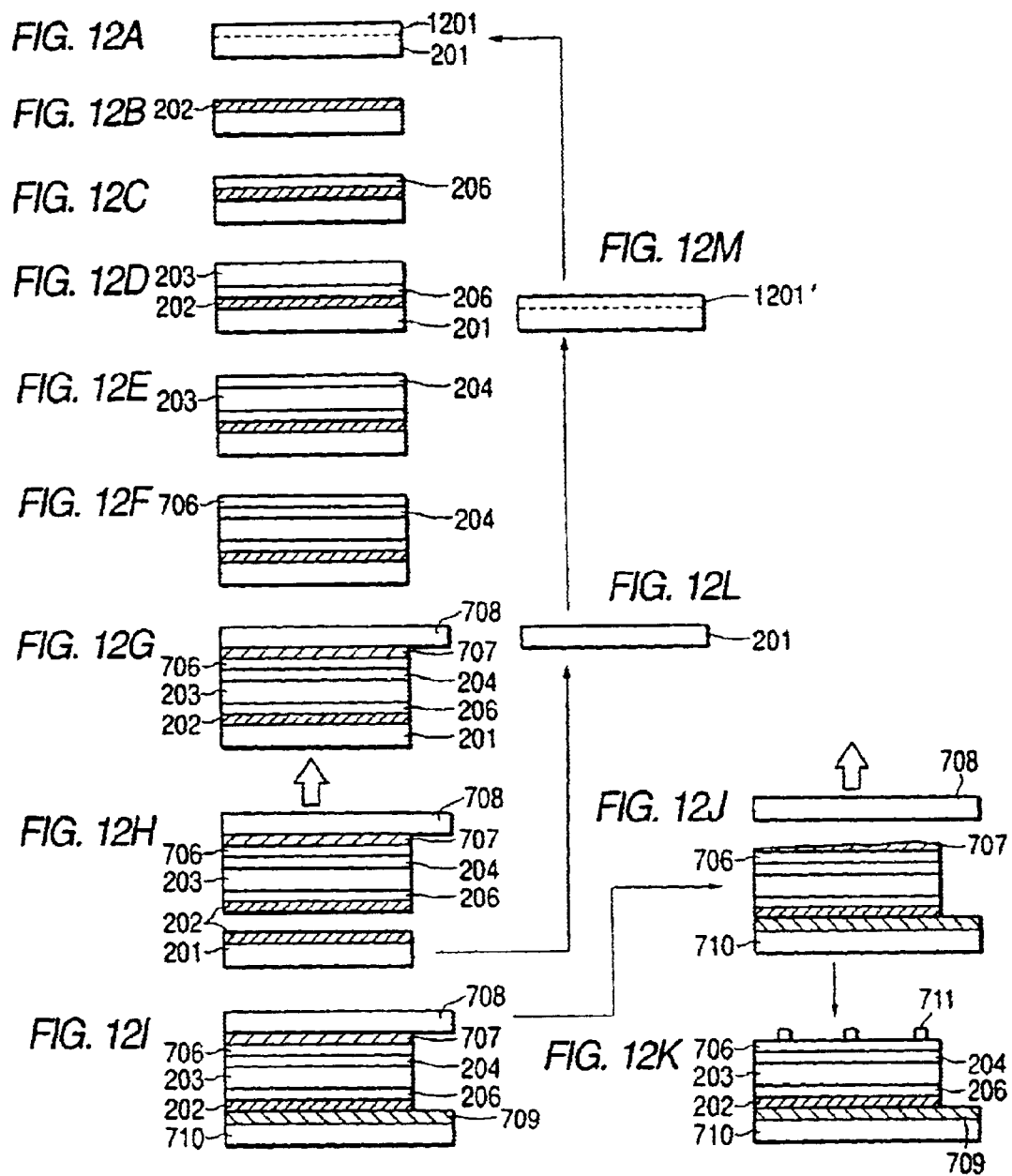

METHOD OF PRODUCING SEMICONDUCTOR MEMBER AND METHOD OF PRODUCING SOLAR CELL

This Application is a division of application Ser. No. 08/199,132, filed Dec. 29, 1997, now U.S. Pat. No. 6,190,937.

BACKGROUND OF THE INVENTION

1. Field of the Invention

The present invention relates to a method of producing a semiconductor member and a method of producing a solar cell. More particularly, the present invention relates to a method of producing a semiconductor member comprising a thin film crystal formed on an inexpensive substrate and a method of producing a solar cell with high performance by using the semiconductor member.

2. Related Background Art

There have been extensively researched a solar cell as a power supply which is systematically coupled with a driving energy source of various equipments or a commercial power. The solar cell is so desired that a device can be formed on an inexpensive substrate to comply with a cost demand. On the other hand, there has been normally employed silicon as semiconductor constituting the solar cell. In particular, from the viewpoint of the efficiency of converting a light energy into an electric power, that is, from the viewpoint of the photoelectric conversion efficiency, single-crystal silicon is very excellent. On the other hand, from the viewpoint of increase in area and reduction in costs, an amorphous silicon is advantageous. Also, in recent years, for the purpose of obtaining the low costs as low as amorphous silicon and high energy conversion efficiency as high as single-crystal, polycrystal silicon has become used.

However, in single-crystal or polycrystal silicon, since a lump-shaped crystal is sliced into a plate-shaped substrate, it is difficult to make its thickness 0.3 mm or less. Thus, the material used for the substrate has not been effectively utilized because the substrate generally has a thickness much over a thickness necessary for absorbing an incident light (20 $\mu$m to 50 $\mu$m). Also, in recent years, there has been proposed a method of forming a silicon sheet by using a spin method in which a liquid droplet of melted silicon is allowed to flow into a die. Even in this method, the thickness of the substrate is about 0.1 to 0.2 mm at the minimum, which is not sufficiently thinned. In other words, there is a room for more reducing the costs by further thinning silicon.

To achieve the above, there has been proposed an attempt of achieving high energy conversion efficiency and low costs of a solar cell in which a thin epitaxial layer grown on a single-crystal silicon substrate is separated (peeled) from the substrate (Milnes, A. G. and Feucht, D. L., "Peeled Film Technology Solar Cells", IEEE Photovoltaic Specialist Conference, p. 338, 1975). In this method, an intermediate layer of SiGe is interposed between single-crystal silicon for forming the substrate and the grown epitaxial layer, and a silicon layer is allowed to (hetero) epitaxially grow thereon. Therefore, the intermediate layer is selectively melted so that the growth layer is peeled off. However, in general, the hetero-epitaxially grown layer is liable to have defects induced on a growth interface because the layer is different in lattice constant from the substrate. Also, this method is not advantageous in the process costs because of use of a material such as germanium which is remarkably expensive more than silicon.

Also, U.S. Pat. No. 4,816,420 discloses that a thin crystal solar cell is obtained by making selective epitaxial growth on a crystal substrate through a mask material, forming sheet-like crystal by using a method of allowing crystal to laterally grow, and thereafter separating the crystal from the substrate. However, in this method, since the sheet-like crystal is mechanically peeled off using cleavage, the sheet-like crystal is liable to be damaged during a peel-off process when the crystal has a certain size or more. In particular, in the case of increasing the area of the crystal as in the solar cell, it becomes difficult to practically employ the above method.

Also, Japanese Patent Application Laid-Open No. 6-45622 discloses that after a porous silicon layer is formed in the surface region of a silicon wafer surface by anodization, the porous layer is peeled off from the wafer, and after the peeled porous layer is fixed onto a metal substrate, an epitaxial layer is formed on the porous layer, to thereby fabricate a thin-film crystal solar cell by using this. However, in this method, since the metal substrate is exposed to a high-temperature process, impurities are liable to be mixed into the epitaxial layer, which leads to a problem that the characteristic is restricted. Also, as realized in the amorphous silicon solar battery, if a thin semiconductor layer is formed on a flexible substrate, for example, a film of polymer such as polyimide, it can be located on a substance having a curved surface, thus expecting the enlargement of an applied field. However, because a high temperature is required in a process of the above-mentioned single-crystal or polycrystal silicon solar cell, it is difficult to use a substrate having poor heat resistance at a high temperature.

By the way, Japanese Patent Application Laid-Open No. 8-213645 discloses that an active layer of the solar cell is allowed to epitaxially grow on amorphous silicon formed in the surface region of a silicon wafer by anodization, and thereafter the active layer can be peeled off from a portion of the porous silicon layer. Therefore, not only the expensive single-crystal substrate can be repeatedly utilized, but also a high-efficiency solar cell can be formed on a flexible low-heat-resistant substrate. However, according to the disclosure of Japanese Patent Application Laid-Open No. 8-213645, the epitaxial growth of the active layer is conducted by the CVD method. In the CVD method, a source gas such as dichlorosilane ($SiH_2Cl_2$) or trichlorosilane ($SiHCl_3$) and a large amount of hydrogen gas are used. When a silicon film is deposited to 20 to 50 $\mu$m in thickness by using a large amount of the expensive gas, it is correspondingly expensive and considerably disadvantageous from the viewpoint of the costs in comparison with amorphous silicon which is required to be deposited to at most 0.5 to 1.0 $\mu$m in thickness.

SUMMARY OF THE INVENTION

The present invention has been made in view of the above circumstances, and therefore an object of the present invention is to provide a method of producing a semiconductor member excellent in characteristics and a method of producing a solar cell by using the semiconductor member.

Another object of the present invention is to provide a method of producing a semiconductor member in which crystal semiconductor excellent in various characteristics can be formed even on a substrate having no high-temperature resistant property and a method of producing a solar cell by using the semiconductor member.

Still another object of the present invention is to provide a method of producing a semiconductor member in which crystal semiconductor excellent in various characteristics can be formed even on a flexible substrate and a method of producing a solar cell by using the semiconductor member.

A further object of the present invention is to provide a method of producing a semiconductor member which can be variously applied, used and arranged and a method of producing a solar cell by using the semiconductor member.

A still further object of the present invention is to provide a method of producing a semiconductor member having excellent semiconductor characteristics at low costs and a method of producing a solar cell having various characteristics such as excellent photoelectric conversion characteristics or use characteristics at low costs by using the semiconductor member.

A still further object of the present invention is to provide a method of producing a solar cell which can exhibit high conversion efficiency.

A still further object of the present invention is to provide a semiconductor member which can be obtained by peeling off an epitaxial layer formed on a crystal substrate from the crystal substrate while reusing the crystal substrate, to provide a semiconductor member having high performance at low costs by use of an inexpensive raw material, and to provide a solar cell which is formed by using the semiconductor member while reusing the crystal substrate, and which has high performance, at low costs by use of an inexpensive raw material.

In order to achieve the above objects, according to the present invention, there is provided a method of producing a semiconductor member or a solar cell, the method comprising the steps of:

forming a porous layer in a surface region of a first substrate;

forming a semiconductor layer on the porous layer by liquid phase epitaxy;

bonding a second substrate to a surface of the semiconductor layer opposite to a semiconductor layer surface bonded to the first substrate; and separating the first substrate from the semiconductor layer by utilizing the porous layer to transfer the semiconductor layer to the second substrate.

Also, according to the present invention, there is provided a method of producing a semiconductor member, the method comprising the steps of:

(a) forming a porous layer in a surface region of a first substrate;

(b) immersing the porous layer into a melting solution in which elements for forming a semiconductor layer to be grown is dissolved up to a supersaturated state or a substantially supersaturated state under a reducing atmosphere to grow a semiconductor layer on a surface of the porous layer;

(c) bonding a second substrate to a surface side of the first substrate on which at least the porous layer and the semiconductor layer are formed; and (d) separating the first substrate from the second substrate at the porous layer to transfer the semiconductor layer separated from the first substrate to the second substrate.

Further, according to the present invention, there is provided a method of producing a semiconductor member, the method comprising the steps of:

(a) forming a porous layer in a surface region of a first substrate;

(b) immersing, into a melting solution in which elements for forming a semiconductor layer to be grown is dissolved up to a desired concentration, the porous layer whose surface temperature is made lower than a temperature at which the melting solution having the desired concentration is saturated, to grow a semiconductor layer on a surface of the porous layer;

(c) bonding a second substrate onto a surface side of the first substrate on which at least the porous layer and the semiconductor layer are formed; and (d) separating the first substrate from the second substrate at the porous layer to transfer the semiconductor layer separated from the first substrate to the second substrate.

In addition, according to the present invention, there is provided a method of producing a semiconductor member, the method comprising the steps of:

(a) forming a porous layer in a surface region of a first crystalline substrate;

(b) growing a first thin-film semiconductor layer on a surface of the porous layer in vapor phase by decomposing a source gas;

(c) immersing the first thin-film semiconductor layer into a melting solution in which elements for forming a second thin-film semiconductor are dissolved up to a saturated state or a supersaturated state under a reducing atmosphere to grow a second thin-film semiconductor layer of a conductive type different from that of the first thin-film semiconductor layer on a surface of the first thin-film semiconductor layer in liquid phase;

(d) bonding a second substrate onto a surface of the second thin-film semiconductor layer or onto a surface of a layer further formed on the second thin-film semiconductor layer;

(e) separating the first thin-film semiconductor layer from the first substrate by exerting a force on the porous layer to transfer the first thin-film semiconductor layer to the second substrate.

Yet still further, according to the present invention, there is provided an apparatus of producing a semiconductor member or a solar cell in which a substrate comprising a porous layer is stored and a semiconductor layer is formed on the porous layer, the apparatus comprising:

a liquid phase growth vessel for immersing a first thin-film semiconductor layer into a melting solution in which elements for forming a second thin-film semiconductor layer are dissolved up to a saturated state or a supersaturated state under a reducing atmosphere to grow a second thin-film semiconductor layer on a surface of the first thin-film semiconductor layer in liquid phase; and means for conveying the substrate between a vapor phase growth vessel and the liquid phase growth vessel while keeping the reducing atmosphere.

In the above method, it is preferable that the semiconductor layer is formed on the porous layer so that the semiconductor layer comprises a region formed by vapor phase epitaxy and a region formed by liquid phase epitaxy in this order.

Also, the above method may further comprise a step of removing the porous layer remaining on the surface of the first substrate after being separated from the semiconductor layer.

Further, it is desirable that the liquid phase epitaxy is conducted by using a melting solution in which elements for forming the semiconductor layer to be grown are dissolved up to a supersaturated state or a substantially supersaturated state.

In addition, it is preferable that the liquid phase epitaxy is conducted under a reducing atmosphere.

Furthermore, it is preferable that the liquid phase epitaxy includes that a melting solution in which the elements for forming the semiconductor layer to be grown are dissolved is brought in contact with the porous layer.

Yet still further, it is preferable that the liquid phase epitaxy includes that a melting solution in which the elements for forming the semiconductor layer to be grown are dissolved is brought in contact with an epitaxial layer formed on the porous layer.

Yet still further, it is desirable that the epitaxial layer is formed by vapor phase epitaxy.

Yet still further, it is preferable that the liquid phase epitaxy includes that a melting solution in which elements for forming the semiconductor layer to be grown is used and the melting solution is brought in contact with the surface of the porous layer while a surface temperature of the porous layer is made lower than a temperature at which the elements in the melting solution having the desired concentration are saturated.

Yet still further, it is desirable that the vapor phase epitaxy is conducted by decomposing a source gas while supplying a gas for forming a reducing atmosphere.

Yet still further, the step of bonding the second substrate may be conducted using an adhesive. In this situation, the adhesive includes a water-soluble adhesive.

Yet still further, there may be provided a third substrate on a separate surface for separating and transferring the semiconductor layer to the second substrate. In this situation, the second substrate may be separated so that the semiconductor layer is transferred to the third substrate.

Yet still further, the second substrate may have a water permeability. Also, the separation of the second substrate may be conducted by lowering of adhesion of the adhesive used for bonding of the second substrate. In this situation, it is desirable that the lowering of the adhesion is conducted by a liquid that has passed through the second substrate.

In addition, the impurities in the porous film may be diffused into the semiconductor layer.

It is preferable that the liquid phase epitaxy is conducted with indium as a solvent.

Yet still further, in the above producing method, it is preferable that prior to the formation of the semiconductor layer into which the impurities are introduced, a semiconductor layer into which no impurities are introduced or impurities are introduced with a low concentration is formed on the tread surface of the first substrate after being subjected to a surface treatment by liquid phase growth.

Yet still further, in the above producing method, semiconductor having a purity of 99.99% or less may be used as the first substrate.

Yet still further, in the above producing method, the first substrate may be a crystalline one, and in particular may be a silicon single-crystal.

Yet still further, in the above apparatus, there may be provided a vapor phase growth vessel for decomposing a source gas in the reducing atmosphere to grow the first thin-film semiconductor layer on the surface of the porous layer of the substrate in the vapor phase.

According to the present invention, epitaxial growth is employed for providing a semiconductor member with higher performance and quality, and also for providing a solar cell with higher conversion efficiency.

In order to perform the epitaxial growth of silicon at low costs, it is advantageous to use the liquid phase growth method rather than a method of using a gas such as the CVD method. In the liquid phase growth method, silicon grains are dissolved in a melted metal such as Sn, In, Cu or Al, a crystalline substrate is immersed therein, and silicon is allowed to grow on the substrate in a state where the solution is made supersaturated state. The liquid phase growth method is expensive in the raw material to be used, and the raw material to be wasted is reduced. Also, since the growth is conducted at a very low temperature in comparison with the melting point of Si such as 100° C. or lower, the liquid phase growth method is advantageous more than the spin method from the viewpoint of an energy. However, when silicon growth is conducted by using the liquid phase growth method in fact, there are not less cases, under the existing circumstances, in which the grown silicon cannot withstand use as the solar cell because of the problem that abnormal crystal grains are grown, or the grown thin-film semiconductor layer cannot be well separated. Therefore, it is normally difficult to accomplish both of high performance as single-crystal or polycrystal and low costs as much as amorphous silicon.

Also, as the substrate (first substrate) for epitaxial growth, there can be used for not only a single-crystal silicon wafer but also a high-quality polycrystal silicon wafer. However, in order to prevent an influence of impurity diffusion from the substrate, there is required high purity of the substrate such that a device is made in the substrate itself. Therefore, from the viewpoint of the costs, it is desirable that the use of the substrate can be repeated at least several tens times. However, as the number of times of repeated use is increased, the anodization condition is varied depending on a variation of the surface state of crystal, etc., thereby making producing management difficult.

Taking the above circumstances into consideration, embodiments of the present invention will be described referring to a solar cell as an example. The present invention utilizes a process of transferring a semiconductor layer to a second substrate. Since on the semiconductor layer of the present invention can be formed a semiconductor device such as a transistor, a diode or an LED as occasion demands, the present invention is not particularly limited to the production of the solar cell.

An example of the structure of a solar cell produced according to the method of the present invention is shown in a schematic cross-sectional views of FIG. 1, and a preferred example of producing steps according to the present invention is shown in schematic cross-sectional views of FIGS. 2A to 2I, respectively. In FIGS. 1 and 2A to 2I, reference numeral 105 and 205 denote substrates; 109 and 209, back-surface electrodes; 104 and 204, p$^+$ (or n$^+$) type layers; 103 and 203, active p$^-$ (or n$^-$) type layers; 106 and 206, n$^+$ (or p$^+$) type layers; 107 and 207, transparent conductive layers; and 108 and 208, collecting electrodes. In this example, the n$^+$ (or p$^+$) type layers 106, 206 and the active p$^-$ (or n$^-$) type layers 103, 203 form a semiconductor junction to produce a photoelectromotive force. The active p$^-$ (or n$^-$) type layers 103 and 203 are main bodies which absorb a solar light to generate carriers and are thickened to about 10 to 50 μm in case of silicon. On the other hand, the n$^+$ (or p$^+$) type layers 106 and 206 is sufficiently thickened to 1 μm or less. Also, the p$^+$(or n$^+$) type layers 104 and 204 form a back-surface field between the electrodes 109, 209 and the layers 104, 204 and provide a function of preventing re-bonding of the carriers in the vicinity of the electrodes 109 and 209 although it is not essential. Also, they sufficiently functions with the thickness of 1 μm or less. In this example, the expressions of the n$^+$ (or p$^+$) type layers 106 and 206, the active p$^-$ (or n$^-$) type layers 103 and 203, and the p$^+$ (or n$^+$) type layers 104 and 204 mean that if the layers 106 and 206 are of n$^+$-type, the layers 103 and 203 are of p⁻-type, and the layers 104 and 204 are of p⁺-type, whereas if the layers 106 and 206 are of p⁺-type, the layers 103 and 203 are of n⁻-type, and the layers 104 and 204 are of n⁺-type. Thus, these layers function with the combination of the respective conductive types, in one combination containing the layers 106 and 206 of n⁺-type, the collecting electrode side generates a negative electromotive force, whereas in the combination containing the layers 106 and 206 of p⁺-type, the collecting electrode side generates a positive electromotive force.

Subsequently, an outline of producing steps according to the present invention will be described with reference to FIGS. 2A to 2I. For example, a single-crystal semiconductor wafer is used as a first subtrate 201 of crystalline. Impurities are thermally diffused, ions are implanted into the surface of the first substrate 201, or impurities are introduced when producing the wafer to make at least the wafer surface p⁺ (or n⁻) type (FIG. 2A). Then, the wafer surface on the side where the impurities are introduced is anodized in a HF solution to form a porous layer 202 (FIG. 2B). In the porous structure formation by anodization, as disclosed in Japanese Patent Application Laid-Open No. 7-302889, an anodization current level is, for example, changed from a low level to a high level on the way in such a manner that a porosity change is given of the structure of the porous layer in advance, thereby being capable of controlling such that the substrate and the semiconductor layer are liable to be separated from each other at the porous layer after epitaxial growth. Subsequently, a single-crystal semiconductor layer 203 that functions as the active p⁻ (or n⁻) type layer is allowed to epitaxially grow on the porous layer by the liquid phase growth method. Then, as occasion demands, a single-crystal semiconductor layer 204 of the p⁺ (or n⁺) type layer is allowed to epitaxially grow. Moreover, a second substrate 205 on which a back-surface electrode 209 is formed is bonded onto the single-crystal semiconductor layer 204, or after the single-crystal semiconductor layer 204 is formed, the back-side electrode 209 is formed on the single-crystal semiconductor layer 204, and then the second substrate 205 is bonded thereonto (FIGS. 2D to 2E). A force is exerted between the bonded second substrate 205 and the first crsytalline substrate 201 to mechanically separate the porous layer, thereby transferring the single-crystal semiconductor layers 203 and 204 from the first crystalline substrate 201 to the second substrate 205 (FIG. 2F). After transfer, the porous layer 202a remaining on the surface of the single-crystal semiconductor member 203 is removed by etching, an n⁺ (or p⁺)-type semiconductor layer 206, a transparent conductive layer 207 and a collecting electrode 208 are formed to complete a solar cell (FIGS. 2G to 2H). A porous layer 202b remaining on the surface of the first crystalline substrate 201 after the completion of separation is removed and treated by etching, etc., and the first crystalline substrate is then again subjected to the first step (FIG. 2A).

Then, the producing method according to the present invention will be described in more detail.

First, an example of using silicon as the material of the first substrate 201 of crystalline as to the porous layer 202 (that is, an example in which the porous layer is made of silicon) will be described. The mechanical strength of the silicon porous layer 202 is considered to be sufficiently weaker than bulk silicon although it depends on the porosity. For example, if the porosity is 50%, the mechanical strength is regarded to be half of the bulk or less. When the second substrate 205 is allowed to bond onto the surface of the porous silicon layer 202, if a sufficient adhesion is exerted between the second substrate 205 and the porous layer 202, the porous silicon layer 202 is destroyed by applying a compression, a tensile force or a sharing force between silicon wafer 201 and the second substrate 205 where the porous layer is formed. If the porosity is more increased, the porous layer 202 can be destroyed with a weaker force.

The silicon substrate can be made porous by the anodization method using an HF solution 10% or more in concentration. A amount of current that flows at the time of the anodization is appropriately in a range of about several to several tens mA/cm² although being appropriately determined depending on the HF concentration, a desired thickness of the porous layer, the surface state of the porous layer or the like. Also, by addition of alcohol such as ethyl alcohol to the HF solution, bubbles of the reactive gas which is generated at the time of the anodization can be removed from a surface to be reacted withiout being stirred, thereby being capable of forming the porous silicon uniformly and efficiently. The amount of alcohol to be added is appropriately determined depending on the HF concentration, a desired thickness of the porous layer, the surface state of the porous layer or the like. In particular, attension has been paid to prevent the HF concentration from being too lowered. The density of the single-crystal silicon is 2.33 g/cm³, whereas the density of the porous silicon layer is varied by varying the concentration of the HF solution in a range of 50 to 20% to be in a range of 1.1 to 0.6 g/cm³. Also, the porosity can be varied by a variation of the anodization current. When the current increases, the porosity also increases more.

Positive holes are required for anodic reaction in formation of the porous silicon by the anodization. For that reason, silicon is made porous using p-type silicon in which positive holes mainly exist (T. Unagami, J. Electrochem. Soc., vol. 127,476 (1980)). However, on the other hand, there has been reported that even a low-resistant n-type silicon is made porous (R. P Holmstrom and J. Y. Chi, Appl. Phys. Lett., vol. 42,386 (1983)). Thus, the low-resistant silicon can be made porous regardless of the kind of p-type or n-type. Also, silicon can be selectively made porous depending on the conductive type so that only the p-type layer can be made porous by conducting the anodization in a dark place as in the FIPOS (Full Isolation by Porous Oxidized Silicon) method.

The porous silicon obtained by subjecting the single-crystal silicon to anodization has pores having a dimeter of about several nm formed according to the observation using a transmission electromicroscope, and its density becomes half of the single-crystal or less. Even in that fact, monocrystallinity is maintained, thereby being capable of allowing an epitaxial layer to grow on the porous silicon. Also, because the porous layer has a large number of pore spaces formed inside thereof, the surface area is remarkably increased in comparison with the volumn. As a result, a chemical etching rate of the porous layer is remarkably accelerated in comparison with the etching rate of the normal single-crystal layer. Further, there has been known that an excellent epitaxial layer is obtained by annealing at 950 to 1,100° C. in a hydrogen atmosphere prior to epitaxial growth. It is presumed that this is because the outermost surface of the porous layer is reconstructed and flattened at a high temperature in a reducing atmosphere (Nikei Micro Device, July of 1994, p. 76).

Similarly, the porous layer is obtained by anodization when single-crystal silicon is replaced by polycrystal silicon, and a crystal silicon layer can grow on the porous layer of polycrystal silicon (in this case, partical epitaxial growth corresponding to a size of crystal grains of the polycrystal silicon is enabled). The more details will be described with reference to various Examples as described below.

Then, the liquid phase growth method for forming the thin-film semiconductor layer will be described. FIG. 3 is a schematic diagram for explanation of the liquid phase growth method in the producing method of the present invention in a thermal equilibrium state of solvent M and solute S (for example, silicon). In the figure, a horizontal axis 501 represents a mean concentration of the solute S in the solution (or apparent concentration depending on circumstances), where a left end thereof represents the state of a pure solvent, and the concentration of the solute S increases toward the right side. Also, a vertical axis 502 represents a temperature of the solution, and the state of the solution is roughly classified into two regions with a curve 503 as its boundary. Also, at a position P in a region 504, the solute S is uniformly dissolved in the solvent M, and its concentration is coincides with the concentration as indicated by the horizontal axis. In a region 505, a part of the solute S is solidified and deposited, and for example, a solid S and the solution having a concentration Dq exist together at a position Q. A substrate made of a material which is not dissolved at a temperature of a state R0 on the curve 503 is immersed in the solution in the state R0, and as the temperature of the solution gradually decreases, the concentration of the solute S in the solution is reduced along the curve 503, for example, up to R1. The solute S corresponding to a difference in concentration between R0 and R1 is deposited on the surface of the substrate as solid. In particular, in the case where the substrate is crystalline, there is a case where the solid S also becomes crystalline according to the crystallinity of the substrate, which is called "epitaxial growth". Normally, when the material of the substrate and the solid S are the same, the epitaxial growth is most facilitated. However, even if they are different in material, the epitaxial growth is enabled (hetero-epitaxial growth). In this way, the thin film semiconductor can be allowed to grow on the surface of the first substrate of crystalline. In general, after the substrate is immersed into the solution which is made just a saturated state or which is made a slightly unsaturated state for a very short time and then is adjusted to the saturate state, the growth of crystal starts. It is presumed that in the above manner, the impurities and the defects are removed from the surface of the substrate by the thermal equilibrium effect, and crystal with high quality is liable to grow. However, it has been proved that there arise some problems when crystal is actually allowed to grow on the porous layer by the liquid phase growth method. Hereinafter, a description will be given on the basis of the experiments which have been conducted by the present inventors.

The epitaxial growth is enabled by methods other than the liquid phase growth method, such as a method of conducting the epitaxial growth by decomposing a gas such as silane ($SiH_4$), dichlorosilane ($SiH_2Cl_2$) or trichlorosilane ($SiHCl_3$) by heat or the action of plasma (CVD method). However, since the liquid phase growth method conducts crystal growth in a state nearest to the thermal equilibrium state, a high-quality thin film semiconductor layer is readily obtained, and also a material necessary for deposition is low in costs.

First, FIG. 4 shows a schematically structural cross-sectional view of a suitable apparatus for growing a semiconductor layer for a solar cell according to the present invention. This apparatus is used in Experimentals 1 to 3 and Example 1.

As shown in FIG. 4, the entire apparatus is roughly classified into three sections. Reference numeral 401 denotes a load lock chamber whose interior can be air-tightly kept by closing an open/close door 402. Reference numeral 403 denotes a nitrogen introduction line which can replace atmosphere in the chamber 401 by nitrogen. Reference numeral 404 denotes a hydrogen annealing vessel or a vapor phase growth vessel, and a sample can be conveyed between the vessel 404 and the load lock chamber 401 through a gate valve 405. Hydrogen or source gases for forming a film can be introduced to the hydrogen annealing vessel 404 from the hydrogen introduction line 406 while controlling the flow rate of hydrogen or source gases. Reference numeral 408 denotes a heater for heating substrates 416 which is located inside of the vessel 404. The substrates 416 each comprising a pair of two silicon wafers bonded to each other are arranged such that each of a plurality of the substrates 416 is in parallel to one another while a certain interval is kept between the substrates by a holder. The substrates can be vertically conveyed through a gate value by a conveying mechanism not shown in the drawing. Reference numeral 409 denotes a liquid phase growth vessel, and a sample can be conveyed between the hydrogen anneal vessel 404 and the liquid phase growth vessel 409 through the gate valve 410. Hydrogen is supplied to the liquid phase growth vessel 409 frm the hydrogen introduction line 411 so that atmosphere can be kept to a reduction state during liquid phase growth. Reference numeral 414 denotes a carbon boat which is heated by the heater 413 in such a manner that elements for forming a semiconductor layer such as silicon and dopant elements as occasion demands are dissolved in a low-melting-point metal such as In which exists inside of the carbon boat 414. Reference numerals 407 and 412 denote gas exhaust tubes, and 615 is a melting material.

Experiment 1

After a p-type silicon wafer, as a substrate, on a surface of which a porous layer was formed by a standard anodization, was held in a hydrogen air flow at a substrate surface temperature (Tsurf) of 1,050° C. for 30 minutes (after annealing), a temperature went down to 900° C. On the other hand, silicon was dissolved into a metal indium solvent at a solvent temperature (Tm) of 900° C. up to a concentration with which the solvent was just saturated. Thereafter, a p-type silicon wafer on a surface of which a porous layer was formed by the standard anodization was immersed in the solvent at the surface temperature Tsurf of 900° C., and then was gradually cooled at a cooling rate of −1° C./min. As a result, a silicon layer was deposited on the surface of the silicon wafer. However, an uneven structure was found on the surface, and also a discontinuous ring-shaped RHEED (reflection high energy electron diffraction) image was obtained. Therefore, it was found that the grown silicon was irregular polycrystal. In addition, when attempt was made to separate that film, there was a part of the film which remained without being separated and the film could not be used for the solar cell. However, when crystal growth is conducted on the porous layer having the same condition by the thermal CVD method using dichlorosilane, there is obtained a single-crystal film with excellent smoothness. Also, the entire film can be completely separated. On the other hand, a high-quality single-crystal is obtained similarly in the case where liquid phase growth is made on the same p-type silicon wafer under the same condition without any formation of the porous layer. In other words, it has been found that an inherent problem is generated when crystal is allowed to grow on the porous layer in the liquid phase.

Experiment 2

Silicon was dissolved in the metal indium at 900° C. until it became just a saturated state. In other words, the temperature Tsat at which the solution was saturated was 900° C.

Then, after the temperature of the solvent was set to the values of Tm column in Table 1, a p-type silicon wafer on a surface of which a porous layer was formed by the standard anodization was annealed in the hydrogen air flow as in Experiment 1, and thereafter was immersed in the solvent while the substrate surface temperature was set to be equal to the temperature of the solvent (Tsurf=Tm), and then is gradually cooled at a cooling rate of −1° C./min to deposit the thin-film silicon having a thickness of 20 μm. As a result, as indicated in Table 1, differences are found in RHEED image and separation state depending on Tm.

TABLE 1

| Tm | RHEED IMAGE | SEPARATION |
|---|---|---|
| 904° C. | Piramid-like nonuniform growth | |
| 902° C. | Discontinuous film | |
| 900° C. | discontinuous ring image | non-separatable |
| 898° C. | foggy spot image | substantially separatable |
| 896° C. | foggy spot image | substantially separatable |
| 894° C. | spot image | completely separatable |
| 892° C. | spot image | completely separatable |

In this experiment, when Tm is lower than Tsat, the amount of silicon corresponding to an amount over the saturated concentration should be immediately deposited as in the point Q of FIG. 3. However, in fact, supersaturated silicon can exist in the solution within some range. The supersaturated state is unstable, and it is presumed that if a solid such as a wafer exists in the solution, silicon starts to be deposited on the wafer from the solution close to its surface.

In this way, it has been proved that the state of the thin film semiconductor is remarkably improved by immersing the silicon wafer after the solution is made in the saturated state to some degree. As a result of experiment while Tsat and Tm were varied, the present inventors have concluded that when a relationship of Tsat−Tm≧5° is substantially satisfied, crystallinity is particularly high, and a well separatable film can be grown. However, if the degree of supersaturated state is remarkable, the solute is immediately deposited from the solution, thereby not performing stable deposition.

The reason why the above result is obtained is presumed by the present inventors, as follows. That is, it is presumed that the solute atoms to be deposited and the solute atoms to be dissolved coexist on the surface of the wafer even in the state where the solute is deposited from the micro viewpoint, and deposition is made when there are a large net amount of solute atoms to be deposited (in this point, it is considered that this method is different from the CVD method in which deposition occurs substantially in one way with chemical reaction of molecules from the vapor phase). Therefore, it is presumed that when net deposition is not made at an initial growth stage, or net deposition rate is low, because a large amount of atoms which are dissolved from the substrate exist, the initial substrate structure is changed with elapse of time. In particular, since the porous layer has a large effective surface area and a high reactivity, delivery of atoms between the substrate and the solute in the solution is frequently made so that the porous layer is liable to be remarkably modified. For that reason, it is presumed that crystallinity is lost or pores are embedded, thereby making it difficult to conduct separation in the following step.

Also, in the liquid phase growth method, it is said that in the initial substrate immersion stage, if the solution is not unsaturated, high-quality crystal cannot be grown. However, if the porous layer is located in a high-temperature reducing atomosphere, the surface defects are removed, and impurities such as oxygen are also removed. Therefore, it is considered from the above circumstances that high-qualitity crystal is more readily obtained in the case where the solution is supersaturated from the initial.

Experiment 3

Silicon was dissolved in a metal indium solvent at 900° C. until the solution had a concentration with which silicon was just saturated. A p-type silicon wafer on a surface of which a porous layer was formed by the standard anodization was annealed in the hydrogen air flow, and thereafter was immersed in the solvent while the substrate surface temperature was set to values of Tsurf column shown in Table 2, and then was gradually cooled at a cooling rate of −1° C./min to deposit the thin-film silicon of 20 μm in thickness. It is presumed that the surface temperature of the substrate coincides with the temperature Tm of the solvent immediately after the silicon wafer is immersed in the solution.

TABLE 2

| Tsurf | RHEED IMAGE | SEPARATION |
|---|---|---|
| 904° C. | piramid-like nonuniform growth | |
| 902° C. | discontinuous ring image | partially separatable |
| 900° C. | discontinuous ring image | non-separatable |
| 898° C. | foggy spot image | substantially separatable |
| 896° C. | foggy spot image | substantially separatable |
| 894° C. | spot image | completely separatable |
| 892° C. | spot image | completely separatable |

It is presumed that although the metal indium solvent is not supersaturated in an initial growth stage, if Tsurf<Tsat, preferably Tsat−Tsurf≧5° is satisified, adverse influence on the porous layer can be substantially prevented. Tsat=Tm= 900° C. is satisfied until cooling starts.

Then, the formation of a junction will be described. In FIG. 1, the $p^+$ (or $n^+$) type layer 104 (for back-surface field formation) on the substrate 105 side and the $n^+$ (or $p^+$) type layers 106 on the ligt incident side can grow by the liquid phase growth method separately from the active $p^-$ (or $n^-$) type layer 103, respectively. For example, in the case where Ga is solvent, Ga is dissolved in the silicon film so that it can be doped to become $p^+$ type. In the case where Sb is solvent, Sb is dissolved in the silicon film so that it can be doped to become $n^+$ type. In the case where In is solvent, since it is difficult to disolve In in silicon, Ga is added to In so that is can be doped to become p-type. Similarly, As is added to In so that it can be doped to become n-type.

Alternatively, the junction may be formed by thermal diffusion after a dopant diffusion source is coated or deposited on the surface of the active layer 103, or by implanting dopant atoms to the silicon layer by ion implantation.

Also, as already described, $n^+$ (or $p^+$) type layer 106 on the light incident side can be formed separately after the semiconductor thin film is separated. In the case of using a substrate having low heat resistance such as a resin film, there is the necessity of applying a depositing method such as the plasma CVD by which deposition is enabled at a low temperature. The more details will be described with reference to Examples.

Subsequently, the first substrate of crystaline and its reuse will be described with reference to FIGS. 2A to 2I. As already described, in order to allow the thin film silicon crystal to grow, it is the best to use a silicon wafer as the first substrate. The entire silicon wafer may be doped to become p-type, or only the surface of the silicon wafer may be doped to p-type in order to conduct anodization of e silicon wafer. As a method of achieving this, there are used measurements such as thermal diffusion or ion implantation. A p-type layer is made porous by anodization to produce a porous layer 202.

Also, the porous layer 202a remaining on the active layer 203 which is separated from the silicon crystal substrate is selectively removed. Also, the porous layer 202b remaining on the surface of the silicon crystal substrate from which the active layer 203 is separated is selectively removed for reuse. Only porous silicon can be chemically etched in an electroless wet manner using at least one kind of a normal silicon etching solution, hydrofluoric acid which is a selective etching solution for porous silicon, a mixture solution in which at least any one of alcohol and hydrogen peroxide water is added to hydrofluoric acid, buffered hydrofluoric acid, and a mixture solution in which at least any one of alcohol and hydrogen peroxide water is added to buffered hydrofluoric acid.

The first substrate is gradually reduced in thickness as the separating step is repeatedly conducted. There is a tendency that roughness and defects on the surface of the silicon layer are gradually increased. The number of times where the silicon wafer can be repeatedly used is restricted by those factors. The number of times where the single-crystal wafer of expensive silicon can be used largely effects the costs. From the above viewpoint, several improvements can be made. That is, the thickness can be restored by conducting epitaxial growth. In this case, it is particularly a convenience to use the liquid phase growth method that enables growth at lower costs.

The above method has several advantages from the viewpoint of reducing the costs. That is, when the epitaxial layer is doped to become p-type during growing, a step of doping for p-type is not required. Also, even when a silicon wafer having low quality such that the concentration of impurities is unstable is used, the reproducibility of the anodization step is improved to stabilize the quality of the porous layer. Moreover, when the epitaxial layer non-doped or doped with a low concentration is deposited prior to a doping step of the surface for p-type, the reproducibility of the anodization can be further improved. Although the generation of roughness, etc., on the surface as it is repeatedly used largely influences a post step, mechanical grinding can be conducted if required.

The above description was given provided that the thin film semiconductor is single-crystal. However, this is not essential. In the application of the present invention to the solar cell, even when the thin film semiconductor is polycrystal, it is put in practical use as a solar cell having sufficiently high performance if the size of crystal grains is about 1 mm as a reference. Even if the first substrate of crystalline is polycrystal, epitaxial growth is locally made within a range of the respective crystal grains, to thereby obtain polycrystalline thin film semiconductor layer. The more details will be described with reference to Examples.

In the solar cell according to the present invention, a polymer film is appropriately used as a low-heat-resistant substrate material to which the thin film crystal semiconductor layer is transferred, and the representative material is polyimide film. Also, glass, a plastic plate made of resin or the like can be used. In the solar cell according to the present invention, as a method of bonding the substrate to the thin film crystal semiconductor layer, there is appropriately used a method in which a conductive metal paste such as copper paste or copper paste is inserted between the substrate and the thin film crystal semiconductor layer to bring them in close contact with each other, and then they are burned and adgered onto each other. In this case, metal such as copper or silver after being burned also functions as a back-surface electrode and a back-surface reflection layer. Also, in case of a substrate such as the polymer film, the substrate and the thin film crystal semiconductor layer may be bonded onto each other in such a manner that a temperature is elevated upto a softening point of the film substrate in a state where the substrate and the thin film crystal semiconductor layer are brought in close contact with each other (in this case, the back-surface electrode is formed on the surface of the thin film crystal semiconductor layer in advance). In the solar cell according to the present invention, for the purpose of reducing the reflection loss of an incident light, the surface of the semiconductor layer can be subjected to a texture treatment. In case of silicon, this treatment is conducted using hydrazine, NaOH, KOH or the like. The height of the piramid to be formed in the texture treatment is appropriately in a range of several to several tens $\mu$m.

Subsequently, an outline of steps of another producing method according to the present invention will be described referring to FIGS. 5A to 5H.

First, as the first substrate 201 of crysalline, there is used, for example, a single-crystal semiconductor wafer. Impurities are introduced by thermal diffusion and ions implantation into the surface of the single-crystal semiconductor wafer or into the wafer during the production of the wafer so that a $p^+$ (or $n^+$) type layer is formed at least on the wafer surface (FIG. 5A).

Then, the wafer surface side where impurities are introduced is subjected to anodization in an HF solution to form the porous layer 202 (FIG. 5B).

Subsequently, the $n^+$ (or $p^+$)-type first single-crystal semiconductor layer 206 is allowed to epitaxially grow on the porous layer by the vapor phase growth method. Keeping the reducing atmosphere, the second single-crystal semiconductor layer 203 that functions as the active $p^-$ (or $n^-$) type layer is allowed to epitaxially grow on the single-crystal semiconductor layer 206 by the liquid phase growth method. Thereafter, if required, the third single-crystal semiconductor layer 204 of the $p^+$ (or $n^+$) type layer is allowed to epitaxially grow (FIG. 5C).

Moreover, the second substrate 205 on which the back-surface electrode 209 has been formed in advance is bonded onto the $p^+$ (or $n^+$) type layer 204, or after the $p^+$ (or $n^+$) type layer 204 is formed, the back-surface electrode 209 is formed on the $p^+$ (or $n^+$) type layer 204, and thereafter the second substrate 205 is bonded onto the $p^+$ (or $n^+$) type layer 204 (FIGS. 5D to 5E).

A force is exerted between the second substrate 205 and the first crystalline substrate 201 as bonded onto each other to then mechanically separate the porbus layer 202, whereby the single-crystal semoiconductor layers 204, 203 and 206 are transferred from the first crystalline substrate 201 to the second substrate 205 (FIG. 5F).

After transfer, the porous layer 202a remaining on the surface of the single-crystal semiconductor layer 206 is removed by etching, and then the transparent conductive layer 207 and the collecting electrode 208 are formed to provide a solar cell (FIG. 5G).

After the first crystalline substrate 201 as subjected to the separation step has the porous layer 202b remaining on its surface is removed and treated by etching, etc., it is again subjected to the initial step (FIG. 5A) as mentioned above (FIG. 5H).

As is apparent from the above description, the example shown in FIGS. 5A to 5H is different from the example of FIGS. 2A to 2I in that the thin film semiconductor layer is allowed to epitaxially grow on the porous layer by the vapor phase growth method, and thereafter the epitaxial growth is conducted by the liquid phase growth method as described with reference to FIGS. 2A to 2I.

Subsequently, the vapor phase growth method for forming the thin film semiconductor layer will be described. As the vapor phase growth method, there are the thermal CVD method, the LPCVD method, the sputtering method, the plasma CVD method, the photo CVD method and so on. A source gas used for crystal growth is represented by silane or silane halide such as $Si_2H_2Cl_2$, $SiCl_4$, $SiHCl_3$, $SiH_4$, $Si_2H_6$, $SiH_2F_2$ or $Si_2F_6$.

Also, as a carrier gas, or for the purpose of obtaining a reducing atmosphere that promotes crytal growth, hydrogen ($H_2$) is added together with the above-mentioned source gas. The mixture ratio of the source gas to hydrogen is properly set to be preferably 1:10 to 1:100 (introduction flow ratio) although it is appropriately determined according to the forming method, the kind of the source gas and also the forming conditions. The ratio is more preferably set to be 1:20 to 1:800.

In the case of forming the compound semiconductor layer, the MOCVD method and the MBE method are used. As the source gas used for those crystal growth, for example, in the case of forming GaAs, $Ga(CH_3)_3$, $AsH_3$, $Al(CH_3)_3$ or the like is used in the MOCVD method.

As a temperature at which growth is conducted, in the case of growing silicon by the thermal CVD method, it is appropriately set to about 800 to 1250° C., and it is desirable that the temperature is more preferably controlled to be 850 to 1200° C. Also, in the case of growing GaAs by the MOCVD method, it is desirable that the temperature is controlled to 650 to 900° C. In the plasma CVD method, it is appropriately about 200 to 600° C., and more preferably 200 to 500° C.

Similarly, a pressure is appropriately about $10^{-2}$ to 760 Torr in methods other than the MBE method, and more preferably $10^{-1}$ to 760 Torr. In case of using the MBE method, the pressure as a back pressure is appropriately $10^{-5}$ Torr or less, and more preferably $10^{-6}$ Torr or less.

Then, the liquid phase growth method for forming a thicker crystal semiconductor layer on the crystal semiconductor layer that has grown by the vapor phase growth method will be described.

The liquid phase growth can be basically conducted by the above-mentioned method.

However, when by the liquid phase method crystal is allowed to grow on the crystal semiconductor layer that has grown by the vapor phase growth method, it is found that there is a case where some problems arise.

Experiment 4

A p-type silicon wafer having a porous layer formed in a surface region by a standard anodization was held in a hydrogen air flow at a surface temperature of Tsurf=1050° C. for 30 minutes, and then the temperature went down to 900° C.

Then, $n^+$-type crystal Si of 0.5 μm in thickness was deposited on the porous layer by the thermal CVD method by using hydrogen as a carrier gas, dichlorosilane ($SiH_2Cl_2$) as a source gas, and phosphine ($PH_3$) as dopant for n-type.

The silicon wafer extracted from the CVD apparatus was set in a liquid phase growing apparatus whose inside was made in a reduciing atmosphere by a hydrogen air flow, and silicon was dissolved in a metal indium solvent of Tm=900° C. until the concentration became just a saturated state. Further, the wafer having the surface temperature Tsurf= 900° C. was immersed in a solution which was adjusted by addition of a slight amount of garium (Ga) as a p-type dopant, and then gradually cooled at a cooling rate of −1° C./min. As a result, a $p^-$-type silicon layer of 25 μm in thickness was deposited on the surface of the silicon wafer. This was regarded as Sample 1.

For comparison, subsequent to formation of the $n^+$-type silicon layer, a $p^-$-type silicon layer having the same thickness was deposited using the same CVD apparatus with diborane ($B_2H_6$) as a p-type doping gas. This was regarded as Sample 2.

Furthermore, for comparison, a $p^-$-type silicon layer was deposited on the $n^+$-type single-crystal wafer in the same manner as that of Sample 1. This was regarded as Sample 3.

As a result of observing the RHEED image of those samples, it could be recognized that epitaxial growth was made because a spot image was found in all the samples. In Samples 2 and 3, spots were clearer and streak lines and Kikuchi lines were obserbed. Thus, it was found that Samples had high quality crytal. Further, the respective samples were immersed in an etching solution in which potassium dichromate was dissolved in an aqueous solution of hydrofluoric acid, and held for 5 minutes as it was for actuarizing defects (which is called "seco. etching"). As a result, defects of about $10^8/cm^2$ were found in Sample 1 by observation through an optical microscope whereas only defects of about $10^5/cm^2$ were observed in Samples 2 and 3. That is, it has been found that when the film formed by the vapor phase growth method and the film formed by the liquid phase growth method are stacked, an inherent problem occurs.

Experiment 5

The CVD apparatus and the liquid phase growing apparatus as used in Experiment 4 were modified in such a manner that they were connected to each other through a gate valve so that the sample could be transported without being exposed to atomoshere. First, an $n^+$-type silicon layer was deposited on the p-type silicon wafer on which the same porous layer as formed in Experiment 4 was formed. Sequentially, while hydrogen was allowed to flow to the CVD apparatus side and the liquid phase growing apparatus side, the gate valve was opened, and the wafer was conveyed from the CVD apparatus side to the liquid phase growing apparatus side. Thereafter, a $p^-$-type silicon layer was deposited by the liquid phase growth method as in Experiment 4. This was regarded as Sample 4.

Then, in order to recognize the effect of the modified apparatus, after crystal growth by the CVD method was completed and then the temperature of the sample was went down to the room temperature, the CVD apparatus side was opened to atmosphere. Thereafter, atmosphere was replaced by hydrogen, the sample was conveyed to the liquid phase growing apparatus side, and a $p^-$-type silicon layer was deposited in the same manner as in Sample 1. This was regarded as Sample 5. The results of the RHEED image and the seco. etching clearly exhibited that Sample 4 was higher in crytallinity than Sample 5.

The present inventors interpret the results of Samples 4 and 5 as follows: That is, the surface of crystal whose growth is completed by the vapor phase growth has contamination such as chlorine. When this contamination is exposed to atmosphere to break the reducing atmosphere, hydrolysis reaction occurs, and the oxidation of the surrface is progressed, which adversely affects crystal growth. As a result, keeping the reducing atmosphere between the vapor phase growth side and the liquid phase growth side can suppress the adverse influence of contamination.

Experiment 6

A series of samples were produced by using the same method as that of Sample 4 in Experiments 5, provided that the surface temperature Tsurf of the substrate was varied immediately before the substrate was immersed in the solution. All the samples exhibited excellent crystallinity. Then, an electrode of stacked magnesium and aluminum was deposited on the surface of those samples. Magnesium was used for obtaining ohmic contact with the p$^-$-type silicon. Since those samples had a junction of n$^+$-type and p$^-$-type, they exhibited the rectifying property as a diode. A ratio of a current value when +1 V is applied to p$^-$-type to a current value when −1 V is applied thereto is defined as a rectifying ratio, and the rectifying ratio of the respective Samples 6 to 10 are represented in Table 3.

TABLE 3

|  | Tsurf | Rectifying Ratio |
| --- | --- | --- |
| Sample 6 | 910° C. | $2 \times 10^2$ |
| Sample 7 | 905° C. | $1 \times 10^3$ |
| Sample 8 | 900° C. | $2 \times 10^4$ |
| Sample 9 | 895° C. | $5 \times 10^5$ |
| Sample 10 | 890° C. | $1 \times 10^6$ |

As shown in Table 3, higher rectifying ratio is obtained when Tsurf is lower than the solution temperature (Tm=900° C.). When Tsurf is higher, etch-back occurs immediately after the substrate is immersed in the solution, and n-type dopant starts to be immersed in the solution. When deposition is again conducted before the n-type dopant is not sufficiently diffused, n-type dopant is considered to be mixed into the active layer which should be naturally of p$^-$-type, thereby adversely affecting the junction characteristic.

BRIEF DESCRIPTION OF THE DRAWINGS

FIGS. 2A, 2B, 2C, 2D, 2E, 2F, 2G, 2H and 2I are schematic views for explaining an example of steps of a method of forming a semiconductor member or a semiconductor device;

FIGS. 10A, 10B, 10C, 10D, 10E, 10F, 10G, 10H, 10I, 10J, 10K, 10L and 10M are schematic processing views for explaining another example of steps of a method of forming a semiconductor member or a semiconductor device;

FIGS. 12A, 12B, 12C, 12D, 12E, 12F, 12G, 12H, 12I, 12J, 12K, 12L, and 12M are schematic views for explaining another example of steps of a method of forming a semiconductor member or a semiconductor device.

DETAILED DESCRIPTION OF THE PREFERRED EMBODIMENTS

Figure 1:
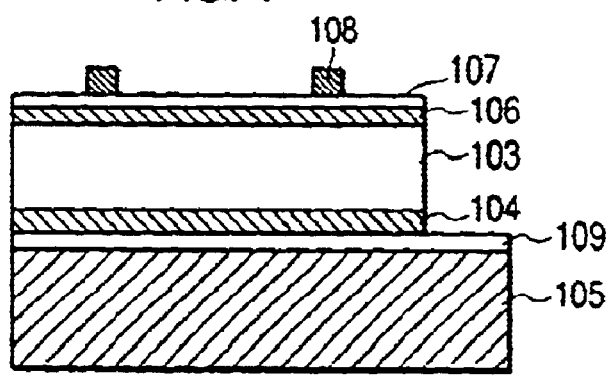
FIG. 1 is a schematic cross-sectional view showing an example of the structure of a solar cell.
Figure 3:
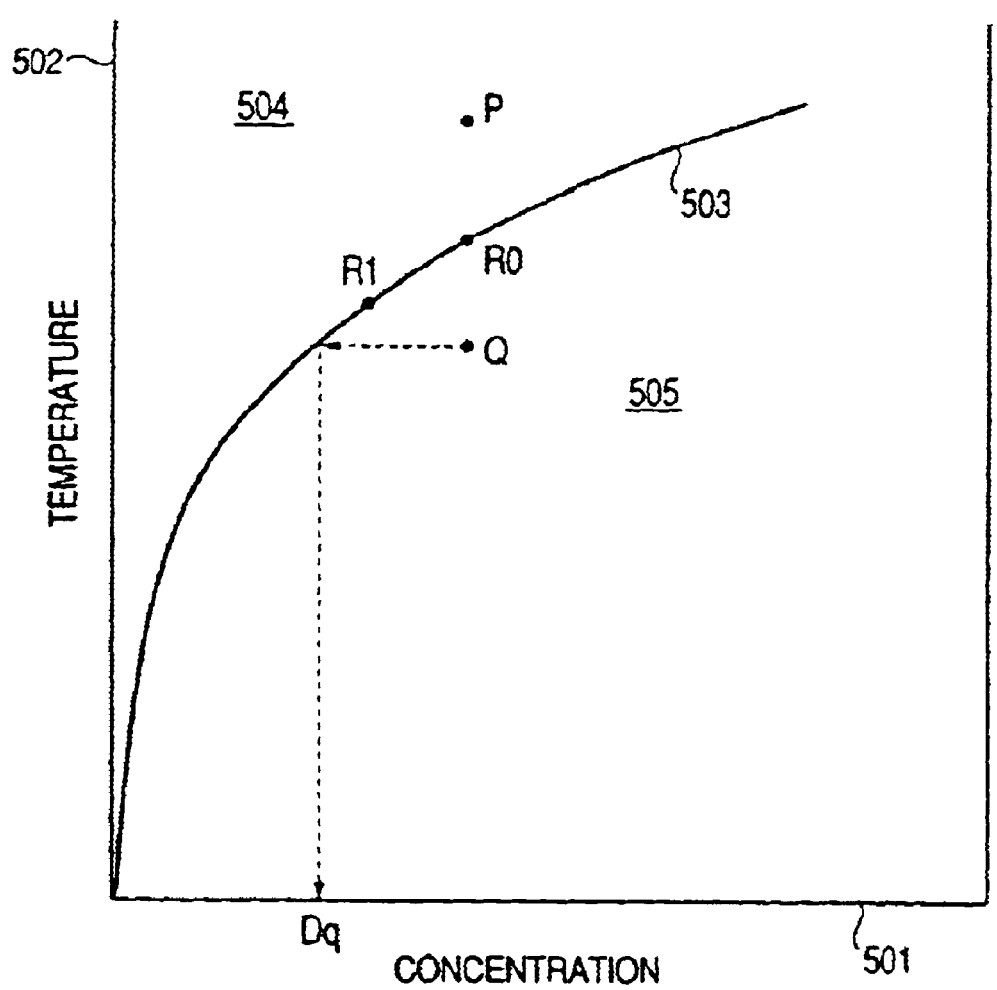
FIG. 3 is a graph showing a relationship between the concentration and temperature of a solute.

Examples of the producing method according to the present invention will be given below in more detail with reference to the accompanying drawings. The present invention is described in the above, and the present invention is not limited to the following Examples.

EXAMPLE 1

This Example exhibits a method of forming a solar cell by transferring a single-crystal silicon layer to a polyimide film by the steps shown in FIGS. 2A to 2I.

Boron (B) was thermally diffused at a temperature of 1200° C. into the surface of single-crystal silicon wafer 201 of 500 µm in thickness by using BCl$_3$ as a heat diffusion source to form a p$^-$ type layer and obtain a diffusion layer of about 3 µm (FIG. 2A). Then, anodization was conducted in an HF solution under the condition shown in Table 4 to form a porous silicon layer 202 on the wafer (FIG. 2B).

TABLE 4

| Anodizatione Solution | HF:H$_2$O:C$_2$H$_5$OH = 1:1:1 |
| --- | --- |
| Current Density | 5 mA/cm$^2$ → 30 mA/cm$^2$ |
| Anodization Time | 2.5 min → (30 sec) → 0 sec |

Then, by using a method of gradually cooling, liquid phase epitaxial growth of silicon was conducted. First, metal indium (In) was melted within the carbon boat in a hydrogen air flow at 900° C. A polycrytal wafer was dissolved while stiring the solution therein until it became saturated. Then, the solution temperature slowly went down to 894° C. to provide a crystal growth solution. Thereafter, the atmospheric temperature was adjusted so that the temperature of the single-crystal silicon wafer on which the porous layer 202 was formed in the hydrogen air flow was set to 1030° C., and then annealed for 1 hour. Thereafter, the temperature was lowered, and waiting was made until it became identical with the temperature of the solution. In this state, the wafer having the porous layer formed on the surface was immersed in the solution, and was gradually cooled at a cooling rate of −1.0° C./min. A no-doped thin film silicon layer 203 of 20 µm in thickness was deposited on the porous layer 202, and was then lifted up from the solution (FIG. 2C). Subsequently, metal indium (In) was melted at 900° C. within a carbon boat separately provided and was saturated with Si. Further, gallium (Ga) containing Si of 0.1 atomic % was melted to provide a crystal growth solution. Sequentially, the wafer on which the non-doped thin-film silicon layer was formed was immersed in the solution to deposit the p$^+$ type thin film silicon layer 204 having thickness of 1 μm on the thin film silicon, and then lifted up from the solution (FIG. 2D).

The copper paste 209 was coated in thickness of 20 μm on one surface of the polyimide film 205 having a thickness of 50 μm by screen printing, and that surface was brought in close contact with and bonded to the surface of the above-mentioned p$^+$ type thin film silicon layer 204 of the wafer. In this state, it was put into an oven so that the copper paste was sintered under the condition of 300° C. and 20 minutes, and the polyimide film and the wafer were bonded onto each other (FIG. 2E). In the polyimide film and the wafer as bonded onto each other, another surface of the wafer which was not bonded was fixed by a vacuum chuck (not shown in the drawing), and a force was exerted from one end of the polyimide film 205 to conduct peeling in such a manner that the silicon layers 203 and 204 were separated from the wafer 201 and then transferred onto the polyimide film 205 (FIG. 2F).

The remainder (porous layer 202a) of the porous layer 202 which remained on the thin film silicon layer 203 after separation from the wafer 201 was selectively etched while being stirred with a mixture solution consisting of hydrofluoric acid, hydrogen peroxide water and pure water. The thin film silicon layer 203 remained without being etched, and only the remainder of the porous layer 202 was completely removed. In the non-porous silicon single-crystal, the etching rate by using the above-mentioned etching solution is very low, and the selective ratio of the etching rate of the porous layer to that of the non-porous layer reaches $10^5$ or more so that the etching amount of the non-porous layer (about several tens Å) can be ignored in practical use. As a result of observing the section of the layer by a transparent electron microscope, it has been recognized that excellent crystallinity is maintained without introducing new crystal defects into the thin film silicon layer 203. After the surface of the thin film silicon layer 203 on the polyimide film 205 as obtained was etched with an etching solution of hydrofluoric acid/nitric acid for cleaning, the microcrystal silicon (hereinafter referred to as "μc-Si") layer 206 of n-type was deposited in thickness of 200 Å on the thin film silicon layer 203 by a plasma CVD apparatus available in the market under the conditions shown in Table 5. In this situation, the dark conductivity of the μc-Si layer was 5 S/cm, where S (siemens) is the inverse number of ohm (Ω).

TABLE 5

| Gas Flow Amount Ratio | $SiH_4/H_2$ = 1 cc/20 cc |
|---|---|
| | $PH_3/SiH_4$ = 2.0 × $10^{-3}$ |
| Substrate Temperature | 250° C. |
| Pressure | 0.5 Torr |
| Discharge Power | 20 W |

Finally, an ITO transparent conductive film (82 nm thick) and a collecting electrode (Ti/Pd/Ag (400 nm/200 nm/1 μm thick)) were formed on the μc-Si layer by the EB (electron beam) vapor deposition to provide a solar cell (FIG. 2H).

As a result of measuring the I–V characteristic of the solar cell obtained by using single-crystal silicon on a polyimide thin film under illumination of AM 1.5 (100 mW/cm$^2$) light, the conversion efficiency of 14.6% was obtained.

Also, the porous layer that remains on the silicon wafer 201 separated was removed by etching in the same manner as described above to produce a smooth surface (FIG. 2I). By using the regenerated wafer thus obtained, the above-mentioned steps were repeated to obtain a plurality of thin film single-crystal solar cells having a semiconductor layer with high quality.

EXAMPLE 2

In this example, a solar cell having the same structure as that of Example 1 was fabricated. In the same manner as that of Example 1, the porous silicon layer 202 was formed on the surface of the single-crystal silicon wafer 201.

Figure 4:
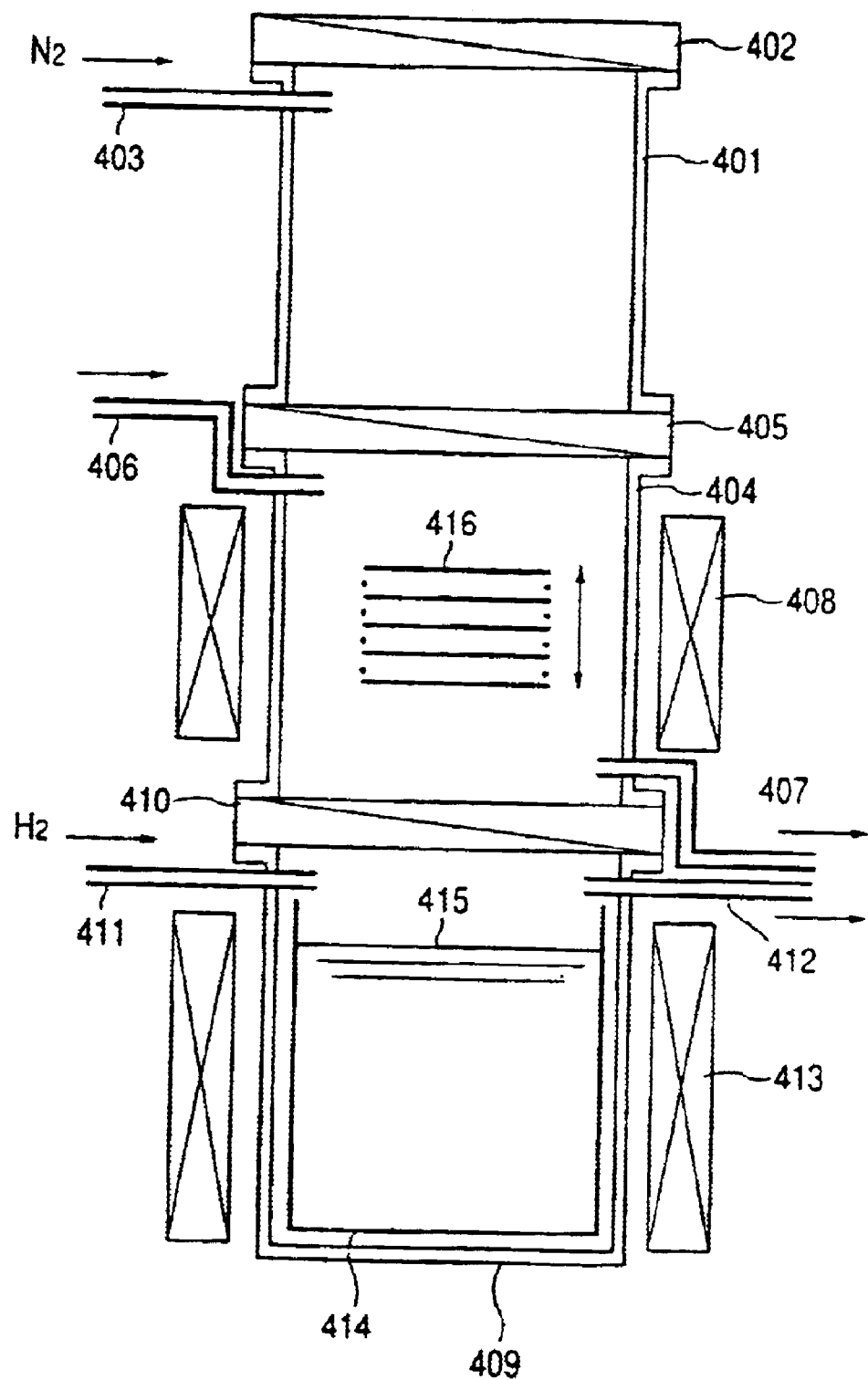
FIG. 4 is a schematic cross-sectional structural view for explaining an example of a producing apparatus.
Figure 6:
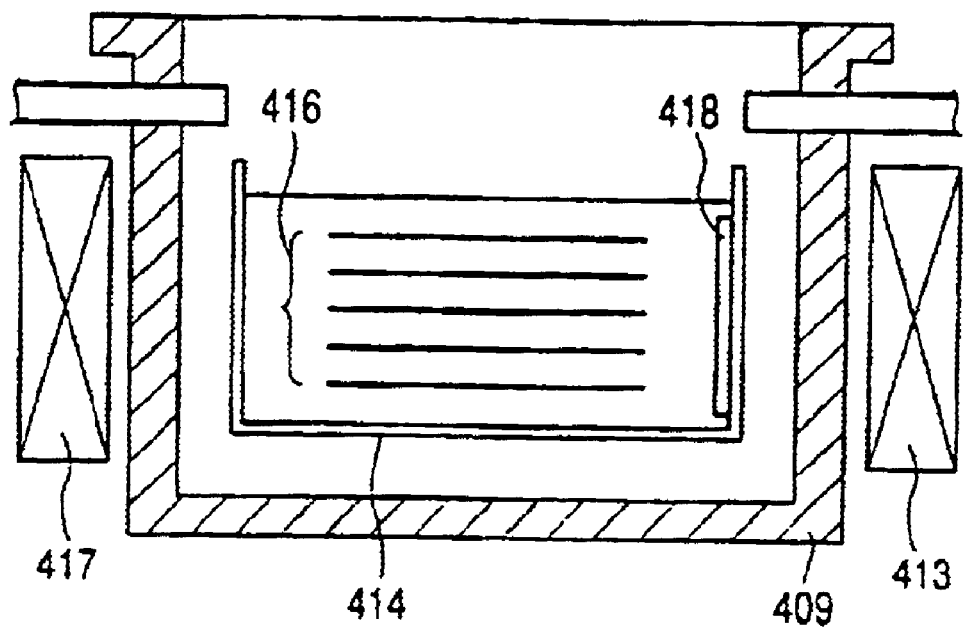
FIG. 6 is a schematic cross-sectional structural view for explaining another example of a producing apparatus.

Then, by using a method which is called "temperature difference method", liquid phase epitaxial growth of silicon was conducted. In this example, the apparatus as shown in FIG. 6 was used which was different in internal structure of the liquid phase growth vessel from the apparatus as shown in FIG. 4. In other words, as shown in FIG. 6, an Si wafer (polycrystal silicon wafer) 418 is stuck onto the right-sided inner wall of the carbon board 414, and also a balance of the heaters 413 and 417 is changed and adjusted in such a manner that a temperature of the right side of the carbon board becomes higher. Therefore, silicon starts to be dissolved under the condition where the solution is non-saturated, and dissolved silicon is diffused leftward. At this side, because the temperature is low so that the solution is supersaturated, silicon is deposited.

First, metal indium (In) was melted at 900° C. within the carbon boat in a hydrogen air flow. Then, a polycrystal silicon wafer 419 for dissolution was immersed in the melted indium and stuck onto a part of the inner wall of the boat. Then, the wafer 419 was dissolved and saturated while being stirred. Subsequently, the temperature of the solution was slowly lowered to 890° C. to provide a crystal growth solution. Thereafter, after annealing in the hydrogen air flow, the atmospheric temperature was adjusted, and waiting was made until the temperature of the single-crystal silicon wafer 201 on which the porous layer 202 was formed became identical with the temperature of the solution. In this state, the wafer 201 on a surface of which the porous layer was formed was immersed in the solution, and the temperature of the wall surface of the boat to which the Si wafer was stuck was set to 910° C. while the peripheral temperature of the single-crystal silicon wafer 201 was adjusted so as not to be changed. Thereafter, in a manner different from Example 1, the wafer was left without any change in the temperature of the solution, etc., and the non-doped thin film silicon layer 203 was deposited in thickness of 20 μm on the porous layer 202 and then lifted up from the solution. In the temperature difference method, since the solution close to the polycrystal silicon wafer for dissolution is non-saturated and silicon continues to be dissolved from the surface of the wafer in a stationary manner, there is no necessity of cooling the entire solution. Subsequently, metal indium (In) was melted at 900° C. within another carbon boat separately provided and saturated with Si. Further, gallium (Ga) containing Si of 0.1 atomic % was melted, and then the temperature was lowered to 890° C. to provide a crystal growth solution. Sequentially, the wafer on which the non-doped thin-film silicon layer was formed was immersed in the solution to deposit the p$^+$ type thin film silicon layer 204 having the thickness of 1 μm on the thin film silicon, and then lifted up from the solution. In this case, because the growth time was short, the thin film silicon layer could be nearly deposited in a stationary manner even without gradually cooling or using the silicon wafer for dissolution.

In the subsequent step, by the same manner as that in Example 1, the thin film single-crystal silicon solar cell was formed on the polyimide film. As a result of measuring the I–V characteristic of the solar cell obtained by using the single-crystal silicon on the polyimide thin film under illumination of AM 1.5 (100 mW/cm$^2$) light, the conversion efficiency of 15.4% was obtained.

Also, the porous layer that remained on the silicon wafer as separated was removed by etching in the same manner as described above to produce a smooth surface (FIG. 2I). Using the regenerated wafer thus obtained, the above-mentioned steps were repeated to obtain a plurality of thin film single-crystal solar cells having a semiconductor layer with high quality.

EXAMPLE 3

In this example, a solar cell having the same structure as that of Example 1 was fabricated. In the same manner as that of Example 1, the porous silicon layer 202 was formed on the surface of the single-crystal silicon wafer 201.

Figure 7:
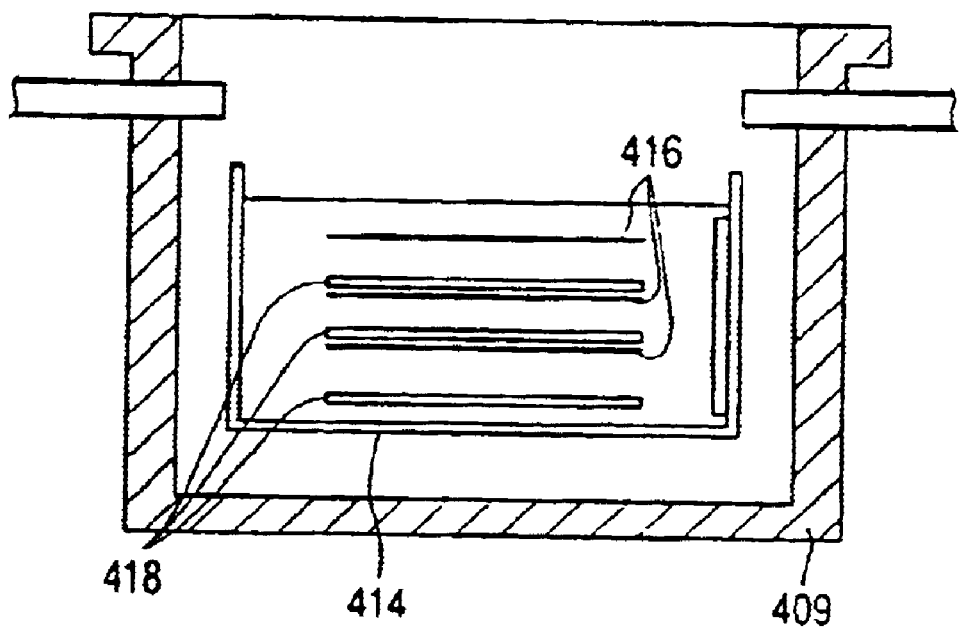
FIG. 7 is a schematic cross-sectional structural view for explaining another example of a producing apparatus.

Then, by a method which is called "constant-temperature method" as disclosed in Japanese Patent Application Laid-Open No. 6-191987 by the present inventors, liquid phase epitaxial growth of silicon was conducted. In this example, the apparatus as shown in FIG. 7 was used which was different in the internal structure of the liquid phase growth vessel from the apparatus shown in FIG. 4. In other words, the substrate and polycrystal silicon wafer 418 are disposed opposite to each other. Because silicon dissolved out from the polycrystal silicon causes convection due to change of the density in the solution so that silicon is transported to the substrate side and deposited thereon. In order to effectively generate this convection, a distance between the substrate and polycrystal silicon needs to be kept long.

First, metal indium (In) was melted at 900° C. within the carbon boat in a hydrogen air flow. Then, a polycrystal silicon wafer for dissolution was immersed in the melted indium and stuck onto the bottom of the boat. Then, the wafer was dissolved and saturated. Subsequently, the temperature of the solution was slowly lowered to 894° C. to provide a crystal growth solution. Thereafter, waiting was made until the temperature of the single-crystal silicon wafer 201 on which the annealed porous layer 202 was formed became equal to the temperature of the solution. In this state, the wafer 201 on a surface of which the porous layer was formed was immersed in the solution, and the surface of the porous layer 202 was opposed to the polycrystal silicon wafer for dissolution at an interval of 2 cm. Thereafter, in manners different from Example 1, without any change in the temperature of the solution, etc., and different from Example 2, without generating the temperature difference in the solution, the solution was left, and the non-doped thin film silicon layer 203 was deposited in thickness of 20 $\mu$m on the porous layer 202 and then lifted up from the solution. In the constant-temperature method, since the solution close to the polycrystal silicon wafer for dissolution is lowered in density by dissolution of Si in the solution, Si is carried away toward the surface of the porous silicon layer 202 due to convection. As a result, silicon continues to be dissolved from the surface of the wafer in a stationary manner and therefore there is no necessity of cooling the entire solution. Thereafter, by the same manner as that of Example 1, the thin film single-crystal silicon solar cell was formed on the polyimide film. As a result of measuring the I–V characteristic of the obtained polyimide thin film/single-crystal silicon using solar cell under illumination of AM 1.5 (100 mW/cm$^2$) light, the conversion efficiency of 16.2% was obtained under the conditions that a cell area was 6 cm$^2$, an open voltage was 0.6 V, a short-circuit photo current was 35 mA/cm$^2$, and a curve factor was 0.79.

Also, the porous layer that remains on the silicon wafer as separated was removed by etching in the same manner as described above to produce a smooth surface (FIG. 2I). Using the regenerated wafer thus obtained, the above-mentioned steps were repeated to obtain a plurality of thin film single-crystal solar cells having a semiconductor layer with high quality.

EXAMPLE 4

In this example, a thin film single-crystal solar cell was fabricated in the same manner as that of Example 1 except that the surface temperature Tsurf of the single-crystal silicon wafer 201 to be immersed in the solution of Tsat=Tm=890° C. Similarly, as a result of measuring the I–V characteristic of the obtained polyimide thin film/single-crystal silicon using solar cell under illumination of AM 1.5 (100 mW/cm$^2$) light, the conversion efficiency of 16.2% was obtained.

EXAMPLE 5

The steps in this example are common to the steps of Example 1 until the non-doped thin film silicon layer 203 is deposited. The sample lifted up from the solution was heated up to 1,200° C. in a hydrogen air flow, and left for 30 minutes. Then, the temperature was again adjusted to 900° C. By this heat treatment, boron (B) in the p-type porous layer 202 was thermally diffused into the non-doped thin film silicon layer 203 to produce the p$^+$ type thin film silicon layer 206. Subsequently, metal indium (In) was melted at 900° C. within aother carbon boat separately provided and saturated with Si. Further, antimony (Sb) containing Si of 0.1 atomic % was melted to provide a crystal growth solution. Sequentially, the wafer on which the non-doped thin-film silicon layer 203 was formed was immersed in the solution to deposit the n$^+$ type thin film silicon layer 204 in thickness of 1 $\mu$m on the thin film silicon, and then lifted up from the solution. Thereafter, the thin film single-crystal solar cell inverse in the order of the doped layers to that of Example 1 was fabricated in the same manner as that of Example 1 except that the step of depositing the n-type microcrystal silicon ($\mu$c-Si) layer 206 by the plasma CVD-apparatus was omitted. Similarly, as a result of measuring the I–V characteristic of the obtained polyimide thin film/single-crystal silicon using solar cell under illumination of AM 1.5 (100 mW/cm$^2$) light, the conversion efficiency of 15.7% was obtained.

EXAMPLE 6

In this example, a solar cell having the same structure as that of Example 1 was fabricated using the steps shown in FIGS. 8A to 8H. In this example, first, the same steps as that of Example 1 were conducted except that an n$^+$-type thin film silicon layer is formed on the porous layer 202 as the n$^+$ (or p$^-$) type layer 206 by the epitaxial method.

Figure 8:
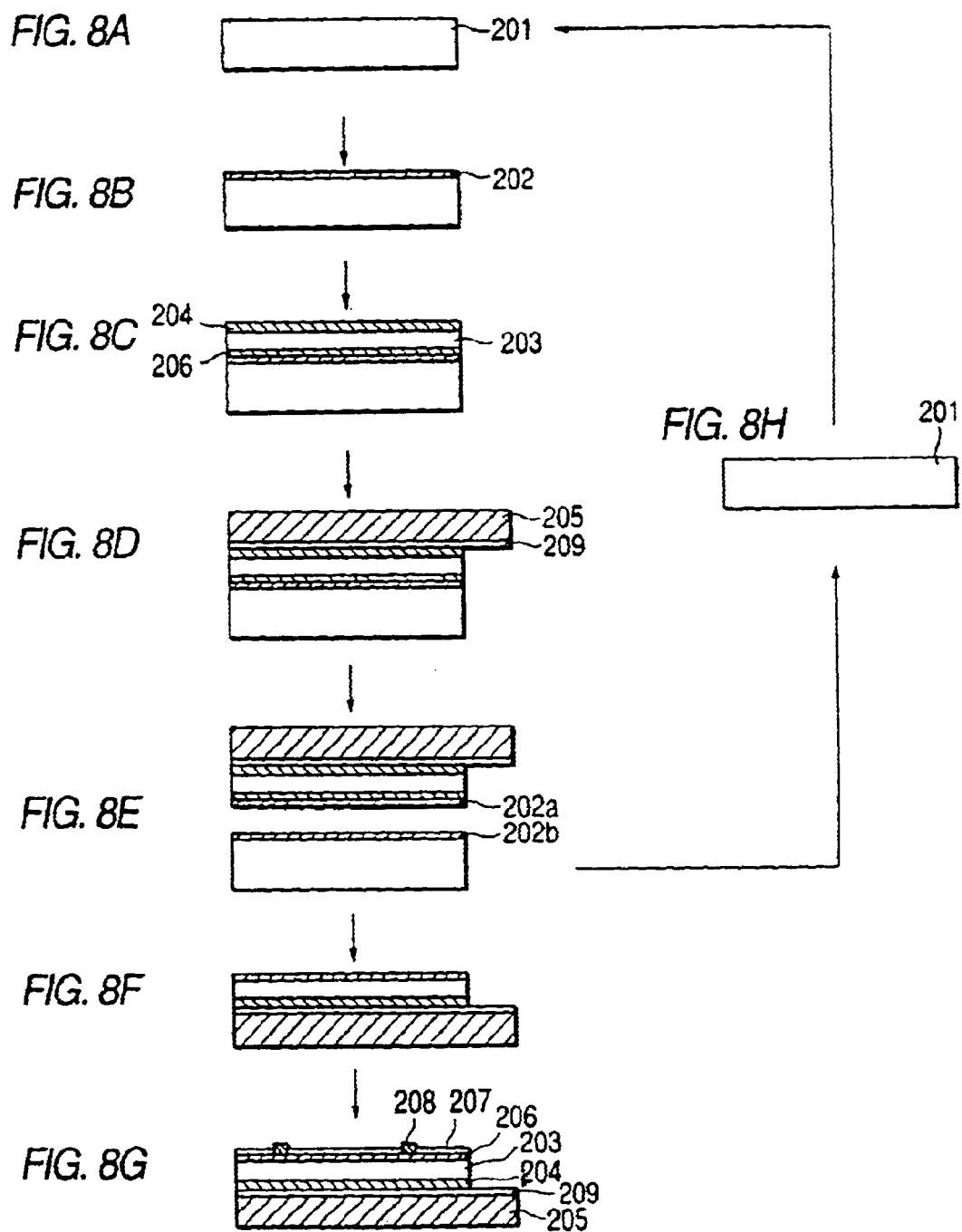
FIGS. 8A, 8B, 8C, 8D, 8E, 8F, 8G and 8H are schematic processing views for explaining another example of steps of a method of forming a semiconductor member or a semiconductor device.

That is, in this example, as shown in FIG. 8B, by the same method as that in Example 1, the porous silicon layer 202 was formed in the surface region of single-crystal silicon wafer 201. Then, metal indium (In) was melted at 800° C. within a carbon boat in a hydrogen air flow. The polycrystal silicon wafer was dissolved while the solution was stirred, and then saturated. Further, antimony (Sb) containing Si of 0.2 atomic % was melted to provide a crystal growth solution. Then, the temperature of the solution was slowly lowered to 794° C. to provide a crystal growth solution. Thereafter, the atmospheric temperature was adjusted, and waiting was made until the temperature of the single-crystal silicon wafer 201 on which the annealed porous layer 202 was formed became equal to the temperature of the solution. In this state, the wafer on a surface of which the porous layer was formed was immersed in the solution, and gradually cooled at a cooling rate of −1.0° C./min to deposit the n⁺ type thin film silicon layer 206 having a thickness of 0.5 μm on the porous layer 202 and lifted up from the solution. Then, in the same manner as that in Example 1, the non-doped thin film silicon layer 203 having a thickness of 20 μm and the p⁺ type thin film silicon layer 204 having a thickness of 1 μm were deposited. Thereafter, the thin film single-crystal solar cell having the same order of the doped layers as that of Example 1 was fabricated in the same manner as that of Example 1 except that the step of depositing the n⁺-type microcrystal silicon (μc-Si) layer 206 by the plasma CVD apparatus was omitted. Similarly, as a result of measuring the I–V characteristic of the obtained polyimide thin film/single-crystal silicon solar cell under illumination of AM 1.5 (100 mW/cm²) light, the conversion efficiency of 16.4% was obtained.

EXAMPLE 7

In this example, the p-type layer formed by the liquid phase growth method instead of the heat diffusion was anodized. First, metal indium (In) was melted within the carbon boat in a hydrogen air flow at 900° C. Then, a polycrystal silicon wafer was dissolved and saturated while the solution was stirred. Moreover, gallium (Ga) containing Si of 0.1 atomic % was melted to provide a crystal growth solution. In this state, the single-crystal silicon wafer 201 having a thickness of 500 μm and the same temperature was immersed in the solution, and gradually cooled at a cooling rate of −1.0° C./min, to thereby form a p-type semiconductor layer of 3 μm in thickness. In the subsequent steps, the thin film single-crystal silicon solar cell having the same structure was obtained in the same procedure as that of Example 1.

Also, the porous layer that remained on the silicon wafer 201 as separated was removed by etching in the same manner as described above to produce a smooth surface (FIG. 2I). Thereafter, the p-type semiconductor layer of 3 μm in thickness was again formed by the above liquid phase growth method, and the thin film single-crystal solar cell having the same structure was obtained in the same procedure as that of Example 1. Thereafter, using the same sigle-crystal silicon wafer 201 in the same manner, there was obtained a large number of thin film single-crystal solar cells having a semiconductor layer with high quality. By conducting these steps, not only the expensive single-crystal silicon wafer 201 can be effectively utilized, but also the step of thermally diffusing B is not required.

EXAMPLE 8

In this example, the thin film polycrystal solar cell was obtained by using the thin film polycrystal formed on the polyimide film in the same manner as that of Example 1 except that the polycrystal silicon wafer of 1,000 μm in thickness and mainly about 0.3 to 3 cm in the diameter of grains was used as the first substrate instead of the single-crystal silicon wafer. In the solar cell as obtained in this manner, it is presumed that crystal orientation of the polycrystal silicon wafer is transferred up to the non-doped layer within the respective crystal grain regions of the polycrystal silicon wafer as used, and epitaxial growth occurs locally. As a result of measuring the I–V characteristic of the obtained thin film polycrystal silicon solar cell thus obtained under illumination of AM 1.5 (100 mW/cm²) light, the conversion efficiency of 13.5% was obtained.

Also, the porous layer that remained on the silicon wafer 201 as separated was removed by etching in the same manner as described above to produce a smooth surface (FIG. 2I). By using the economical regenerated wafer as thus obtained, the above-mentioned steps were repeated to obtain a plurality of thin film polycrystal solar cells having a semiconductor layer high in quality.

EXAMPLE 9

In this example, the polycrystal silicon substrate produced in such a manner that ingot upgraded from the inexpensive metal-graded silicon 98.5% in nominal purity by the CZ (Czochralski) method was sliced into pieces 1 mm in thickness, and the surfaces of a wafer was mirror-ground and the wafer was used the first substrate 201. The metal-graded silicon is inexpensive coarse silicon which is used also as a raw material of aluminum alloy or the like. Although this silicon is very inexpensive in comparison with normal silicon for semiconductor, there is no case where it is used for electric devices as it is because it contains impurities with high concentration. As a result of analyzing the elements near the surface the metal-graded silicon substrate as produced, the concentration of impurities was slightly more than 0.01% (the purity of Si was slightly less than 99.99) in total, as shown in Table 6. Also, the diameter of the crystal grains of the metal-graded silicon substrate was several mm to several cm (FIG. 2A).

TABLE 6

| Impurity | Concentration |
| --- | --- |
| Ca | 42 ppm |
| B | 38 ppm |
| Al | 22 ppm |
| Ni | <5 ppm |
| Fe | 10 ppm |
| Cr | 0.6 ppm |
| Mn | <0.2 ppm |
| Ti | <1 ppm |

On this wafer, the non-doped layer of 1 μm in thickness and the p-type layer of 3 μm in thickness were formed in this order by the liquid phase growth method as described in Example 7 and then this p-type layer was anodized. As shown here, there are many cases where the metal-graded silicon is of p-type, but because the degree of doping is unstable, the reproducibility of the anodization is liable to be deteriorated. The p-type layer controlled by the liquid phase growth method is formed and subjected to anodization, thereby being capable of improving the reproducibility of the anodization. Further, by interposing a non-doped layer between the polycrystal silicon and the p-type layer formed by the liquid phase growth method, the controllability of the depth of the anodization is improved. The subsequent steps were conducted in the same procedure as that of Example 1 to obtain the thin film polycrystal silicon solar cell having the same structure.

Also, the porous layer that remained on the silicon wafer 201 as separated was removed by etching in the same manner as described above to produce a smooth surface (FIG. 2I). Thereafter, the non-doped layer of 1 μm in thickness and the p-type layer of 3 μm in thickness were again formed by the above liquid phase growth method to obtain the thin film polycrystal solar cell having the same structure in the same procedure as that of Example 1. Thereafter, the same procedure was repeated, using the same metal-graded polycrystal silicon wafer to obtain a still larger number of thin film polycrystal solar cells having a semiconductor layer with high quality. By conducting these steps not only the low-graded polycrystal silicon wafer could be utilized, but also the step of thermally diffusing B was not required.

EXAMPLE 10

Figure 9:
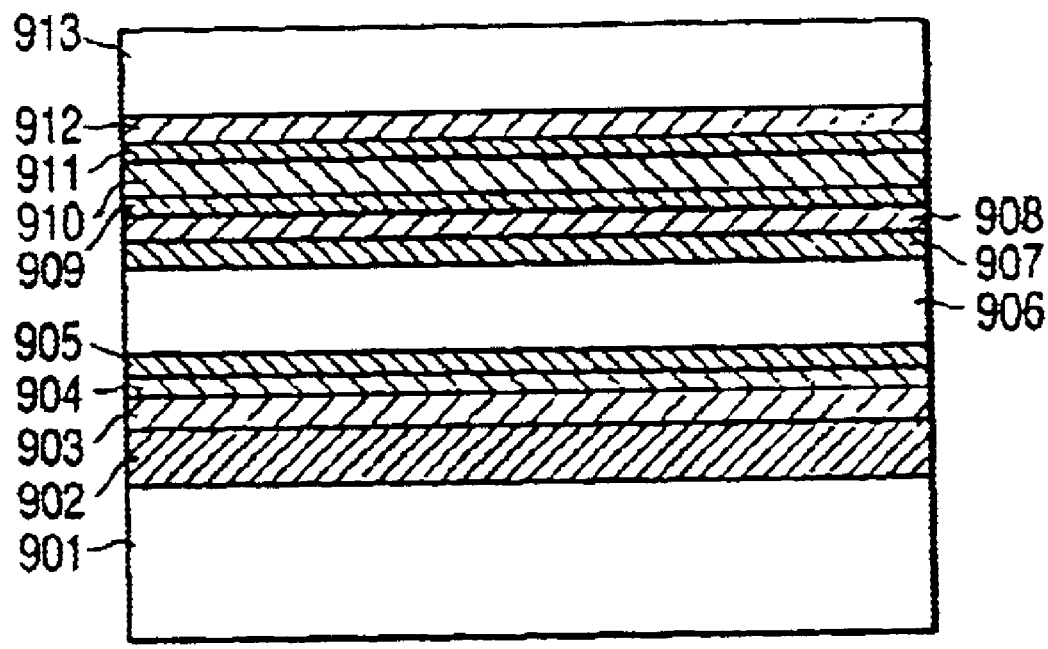
FIG. 9 is a schematic cross-sectional view showing another example of the structure of a solar cell.

In this example, there is shown a method in which the compound semiconductor layer having the structure as shown in FIG. 9 is transferred to acrylic resin to form a super-high efficient tandem type solar cell.

In FIG. 9, reference numeral 901 denotes a substrate; 902, a porous layer; 903, an $n^+$ type layer; 904, an $n^+$ type layer; 905, an n type layer; 906, a p type layer; 907, a $p^+$ type layer; 908, a p type layer; 909, an $n^+$ type layer; 910, an type n layer; 911, an $n^+$ type layer; 912, an n type layer; and 913, a p type layer. Therefore, the respective conductive type semiconductor layers are formed on the porous layer 902 in the order of $n^+/n^+/n/p/p^+/p/n^+/n/n^+/n/p$.

In this example, the compound semiconductor is used, and the composition of the respective layers are stated below.

The $n^+$ type layer 903 is $n^+$ type GaAs; the $n^+$ type layer 904 is $n^+$ type $Al_xGa_{1-x}As$; the n type layer 905 is n type $Al_{0.37}Ga_{0.63}As$; the p type layer 906 is p type $Al_{0.37}Ga_{0.63}As$; the $p^+$ type layer 907 is $p^+$ type $Al_{0.37}Ga_{0.63}As$; the p type layer 908 is p type $Al_{0.37}Ga_{0.63}As$; the $n^+$ type layer 909 is $n^+$ type $Al_xGa_{1-x}As$; the n type layer 410 is n type $Al_{0.37}Ga_{0.63}As$; the $n^+$ type layer 411 is $n^+$ type $Al_{0.09}Ga_{0.1}As$; the n type layer 412 is n type GaAs; and the p type layer 413 is p type GaAs.

Then, a specific producing example will be described.

First, B (boron) was thermally diffused into the surface of single-crystal silicon wafer of 500 μm in thickness as the substrate 901 by using $BCl_3$ as a heat diffusion source at a temperature of 1,200° C. to form a $p^+$ type layer and obtain a diffusion layer of about 3 μm. Then, anodization was conducted in an HF solution under the condition shown in Table 7 to form on the wafer a porous silicon layer as the porous layer 902.

TABLE 7

| | |
|---|---|
| Anodization Solution | $HF:H_2O:C_2H_5OH$ = 1:1:1 |
| Current Density | 1 mA/cm² → 5 mA/cm² → 40 mA/cm² |
| Anodization Time | 2 min → 2.5 min → (30 sec) → 0 sec |

Then, by the gradually cooling method, liquid phase hetero-epitaxial growth of silicon was conducted. First, metal gallium (Ga) was melted within the carbon boat in a hydrogen air flow at 810° C. Arsenic (As) was dissolved in the melted indium until it became saturated. On the other hand, after the porous layer 902 was annealed at 1,050° C. in a hydrogen atmosphere for 7 minutes, the temperature was lowered to 800° C. Thereafter, the solution temperature was adjusted to 800° C., and the single-crystal silicon wafer on which the porous silicon layer 902 was formed was immersed in the solution, and the solution temperature was slowly lowered at a rate of –0.1° C./min to allow the $n^+$ type GaAs layer 903 to grow. Then, aluminum (Al) was brought in contact with the gallium solution and gradually dissolved in the solution to continue the crystal growth, thereby growing a transition layer 904 (mentioned as $Al_xGa_{1-x}As$) of $n^+$ type in which the concentration of Al was gradually varied. When attaining at x=0.37, the contact of Al with gallium solution was suspended, and while the concentration of Al was kept constant, the n type $Al_{0.37}Ga_{0.63}As$ layer was allowed to grow. Then, the substrate on which up to the n type $Al_{0.37}Ga_{0.63}As$ layer was formed was immersed into another Ga solution of 800° C. containing Al and As with p-type dopant which was separately prepared. Then, the solution was cooled at –0.1° C./min to grow the p-type $Al_{0.37}Ga_{0.63}As$. Further, the amount of dopant was increased to grow the $p^+$-type $Al_{0.37}Ga_{0.63}As$ layer. By the same procedure as mentioned above, the p-type $Al_{0.37}Ga_{0.63}As$ layer, the $n^+$-type $Al_xGa_{x-1}As$ layer, the n-type $Al_{0.37}Ga_{0.63}As$ layer, the $n^+$-type $Al_{0.9}Ga_{0.1}As$ layer, the n-type GaAs layer, and the p-type GaAs layer were allowed to grow.

After Pd/Au was formed on the p-type GaAs layer which was the outermost layer formed by the EB vapor deposition, a copper paste was coated in thickness of 10 to 30 μm on one surface of an acrylic plate having a thickness of 1 μm by screen printing, and the coated surface was brought in close contact with and bonded to the above-mentioned wafer $p^+$ type GaAs layer side. In this state, it was put into an oven so that the copper paste was sintered under the condition of 300° C. and 20 minutes, and the acrylic resin plate and the wafer were bonded onto each other. In the acrylic resin plate and the wafer as bonded onto each other, another non-bonded surface of the wafer and another non-bonded surface of the acrylic resin plate were fixed by a vacuum chuck (not shown in the drawing), respectively, and a tensile was uniformly exerted on those chucks perpendicularly to the bonded surfaces so that the porous layer 902 was destroyed to separate the growth layer from the wafer and transferred onto the acrylic resin plate. The porous layer which remained on the $n^+$ type GaAs layer which was separated from the silicon wafer was selectively etched with a mixture solution of ethylene diamine, pyrocatechol and pure water at 110° C. The $n^+$type GaAs layer remained without being etched, and only the porous layer was completely removed. The etching rate of single-crystal GaAs by using the above-mentioned etching solution is very low so that the reduction of the thickness can be ignored in practical use. As a result of observing the section of the layer by a transparent electro-microscope, it has been recognized that excellent crystallinity is maintained such that a new crystal defect is not introduced in the growth layer.

Then, the $n^+$ type GaAs layer which was the outermost surface layer was allowed to remain in the shape of a grid by etching other portions than the grid so that the $n^+$ type $Al_xGa_{1-x}As$ layer was exposed, and then the surface electrode (Au/Ge/Ni/Au) was formed only on the grid-shaped $n^+$ type GaAs layer by the EB vapor deposition and photolithography. Thereafter, $TiO_2/MgO$ was deposited as a reflection preventing layer by the plasma CVD method to provide a solar cell.

As a result of measuring the I–V characteristic of the obtained thin film compound semiconductor silicon solar cell using the acrylic resin plate under illumination of AM 1.5 (100 mW/cm²) light, the conversion efficiency of 23.8% was obtained.

Also, the porous layer that remained on the silicon wafer as separated was removed by etching in the same manner as described Examples 1 and 2 to produce a smooth surface. By using the regenerated wafer as thus obtained, the above-mentioned steps were repeated to obtain a plurality of thin film compound semiconductor solar cells having a semiconductor layer with high quality.

EXAMPLE 11

In this example, an example of producing a stagger type field effect transistor using the single-crystal silicon will be described with reference to the steps shown in FIGS. 10A to 10M.

As a substrate, the single-crystal silicon wafer 601 having thickness of 500 μm was prepared (FIG. 10A). Then, B was thermally diffused on the surface of the single-crystal silicon wafer 601 with BCl₃ as the thermal diffusion source at a temperature of 1,200° C. to form a p⁺ type layer, thus obtaining a diffusion layer of about 3 μm. Subsequently, in the same manner as that of Example 1, the porous layer 602 was obtained (FIG. 10B). Then, the liquid phase epitaxial growth of silicon was conducted by the gradually cooling method. That is, first, a saturated solution of 900° C. was prepared within the carbon board in a hydrogen air flow, and arsenic (As) was dissolved as the n-type dopant, and then the temperature of the solution was slowly lowered to 894° C. to provide a crystal growth solution. Then, the atmospheric temperature was adjusted so that the temperature of the single-crystal silicon wafer 601 on which the porous layer 602 was formed in the hydrogen air flow was set to 1,030° C., and then annealed for 1 hour. Thereafter, the temperature was lowered, and waiting was made until it became equal to the temperature of the solution. In this state, the wafer on a surface of which the porous layer was formed was immersed in the solution so that the thin film silicon layer 603 of 0.1 μm in thickness was deposited on the porous layer 602 (FIG. 10C). Subsequently, a saturated solution of 900° C. was prepared within another carbon boat, and the temperature of the solution in the another carbon boat was slowly lowered to 894° C. The wafer on which the n⁺ type thin-film silicon layer 603 was formed was immersed in the solution to deposit the p⁻ type thin film silicon layer 604 having thickness of 0.3 μm thereon, and then lifted up from the solution (FIG. 10D). Then, the surface side of the p⁻ type thin film silicon layer 604 was oxidized to 0.1 μm in depth by the heat treatment in a steam to provide a gate insulated film (FIG. 10E). On the film, an aluminum film was deposited by the sputtering method, and a gate electrode/gate wiring 606 were formed by the photolithography process (FIG. 10F). On the film, the glass substrate 608 was stuck through the SiO₂ film 607 by the sol/gel method (FIG. 10G). Thereafter, the wafer 601 was separated at the portion of the porous layer 602 (FIG. 10H), and after the remainder of the porous layer 602 was removed (FIG. 10I), the n⁺ type thin film silicon layer 603 was patterned as indicated by reference numerals 603' and 603'' by the photolithography process (FIG. 10J). Moreover on the film, a silicon nitride film 609 was deposited, and contact holes for source/drain electrodes were patterned by the photolithgraphy process (FIG. 10K). Further, an aluminum layer was deposited and patterned by the photolithgraphy process, to thereby form the drain electrode/drain wiring 610' and the source electrode/source wiring 610'' (FIG. 10L).

Since the transistor thus produced had thin p⁻ type layer of single-crystal, it obtained very high on/off ratio of the drain current by the on/off of the gate voltage, and also obtained large drain current. Therefore, even when the area of the transistor is small, a large drive performance is provided. Also, since it is of the stagger type although single-crystal is used, the free degree of the drain/gate wiring is as large as that of the transistor using amorphous silicon, and when the transistor is used for the matrix driving of liquid crystal, the high contrast, the high-speed operation and the high opening degree can be readily realized. Similarly, the remaining porous layer 602 is removed from the single-crystal silicon wafer 601 as separated (FIG. 10M), and it is reused as occasion demands.

EXAMPLE 12

Figure 11A:
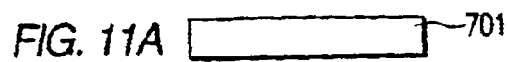
FIGS. 11A, 11B, 11C, 11D, 11E, 11F, 11G, 11H, 11I and 11J are schematic views for explaining an example of steps of a method of forming a semiconductor member or a semiconductor device.
Figure 11B:

In this example, an example of fabricating an LED of GaAlAs type will be described by using the steps shown in FIGS. 11A to 11J. First, a GaAlAs wafer 701 was prepared (FIG. 11A). Then, the single-crystal p-type GaAs wafer 701 having a thickness of 800 μm was anodized under the conditions shown in Table 8 to form a porous layer 702, taking "Report by P. Schmuki, et al. (P. Schmuki, J. Fraser, C. M. Vitus, M. J. Graham, H. S. Issacs J. Electrochem, Soc. 143 (1996) pp. 3316)" into account (FIG. 11B).

TABLE 8

| Anodization Solution | HCl:H₂SO₄:NH₄H₂PO₄ = 1:1:3 |
|---|---|
| Applied Voltage | 300 V → 1,000 mA/cm² |
| Anodization Time | 1 min → 5 sec |

Figure 11C:
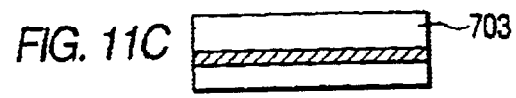
Figure 11D:
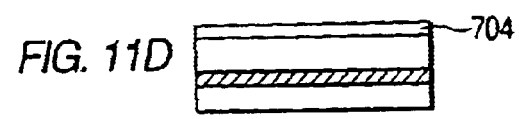
Figure 11E:
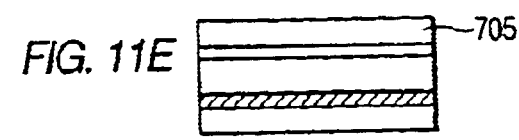
Figure 11F:
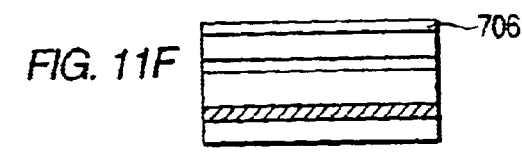
Figures 11G, 11I:
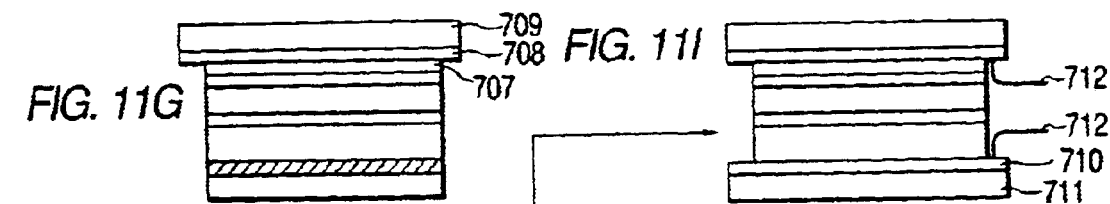
Figures 11H, 11J:
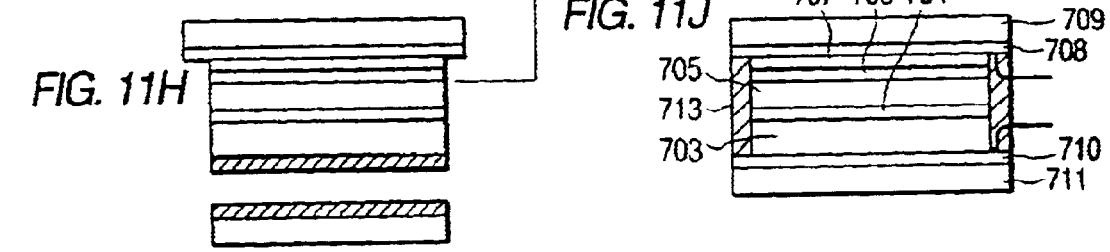

Then, liquid phase hetero-epitaxial growth of compound semiconductor was conducted. First, metal gallium (Ga) was melted within the carbon boat in a hydrogen air flow at 810° C. Arsenic (As) was dissolved in the melted indium until it became saturated. Thereafter, the solution temperature was adjusted to 800° C., and while the single-crystal silicon wafer 701 on which the porous silicon layer 702 was formed was immersed in the solution, aluminum (Al) was brought in contact with the solution and gradually dissolved in the solution to continue the crystal growth, whereby the transition layer ($Al_xGa_{1-x}As$) where the concentration of Al was gradually varied was allowed to grow (FIG. 11C). The growth of the transition layer 703 was conducted with being immersed in the solution at the surface temperature of 800° C. The gradually cooling condition was set to −0.1° C./min. When attaining at x=0.37, the contact of Al with gallium solution was suspended, and while the concentration of Al was kept constant, the $Al_{0.37}Ga_{0.63}As$ layer 704 was allowed to grow (FIG. 11D). Then, by using another solution as separatedly prepared, a light emitting layer $Al_{0.5}Ga_{0.5}As$ layer 705 was grown (FIG. 11E). Again, as the barrier layer, an $Al_{0.37}Ga_{0.63}As$ layer 706 was grown (FIG. 11F). Subsequently, a glass 709 coated with an SnO₂ transparent conductive layer 708 was bonded to sol-gel film 708 of In₂O₃ (FIG. 11G), and then wafer 701 was separated (FIG. 11H). Moreover, a glass 711 was bonded to the separated glass 709 side by a copper paste layer 710, and a lead line 712 was drawn out from the SnO₂ transparent conductive layer 708 and the copper paste layer 710 (FIG. 11I). In this way, the side surfaces were sealed with a resin 713 (FIG. 11J). In this way, high-luminant face light emitting red color LED could be obtained. In this way, in particular, an emitted light is effectively reflected on the surface of the copper paste layer 710, and because the SnO₂ transparent conductive layer 708 and the sol-gel film 707 of In₂O₃ reduce a reflection loss due to a large difference in the refractive ratio between the glass 711 and the $Al_{0.37}Ga_{0.63}As$ layer 706, luminance becomes high.

EXAMPLE 13

This example shows an example of a method of forming a solar cell by transferring a single-crystal silicon layer onto a polyimide film by the wteps shown in FIGS. 5A to 5H, using an apparatus shown in FIG. 4.

Figure 5A:
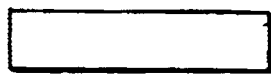
FIGS. 5A, 5B, 5C, 5D, 5E, 5F, 5G and 5H are schematic views for explaining another example of steps of a method of forming a semiconductor member or a semiconductor device.

First, as a substrate 201, the single-crystal silicon wafer having thickness of 500 μm was prepared (FIG. 5A). Then, B was thermally diffused on the surface of the single-crystal silicon wafer with Bcl₃ as the thermal diffusion source at a temperature of 1,200° C. to from a P⁺ type layer, thus obtaining a diffusion layer of about 3 μm in thickness.

Figure 5B:

Then, anodization was conducted under the condition shown in Table 9 in an HF solution to form a porous silicon layer on the wafer as a porous layer 202 (FIG. 5B).

TABLE 9

| Anodization Solution | HF:H$_2$O:C$_2$H$_5$OH = 1:1:1 |
|---|---|
| Current Density | 5 mA/cm$^2$ → 30 mA/cm$^2$ |
| Anodization Time | 2.5 min → (30 sec) → 0 sec |

The two substrates as thus produced were paired in such a manner that the porous layers were directed outwardly, that is, back to back, and five pairs were set by a holder made of quartz glass so that five pairs were kept at intervals of 1 cm. This was set in a load lock chamber of the apparatus shown in FIG. 4, and after the door was closed, atmosphere inside thereof was replaced by nitrogen.

Then, the gate valve 405 was opened, and the substrate 416 supported by the substrate holder was transported to the vapor phase growth vessel 404. After transportation, the gate valve 405 was closed, the inside was replaced by hydrogen, and the temperature of the substrate started to elevate while hydrogen was allowed to flow into the vessel. When the temperature was elevated up to 1,000° C., that state was kept for 30 minutes, during which the smoothing of the porous layer surface was progressed.

Then, the first n$^+$ type crystal silicon layer of 0.2 μm in thickness was deposited under the condition shown in Table 10. Upon the completion of growth, while the inside of the vapor phase growth vessel 404. was replaced by hydrogen, the temperature of the substrate holder was lowered to 900° C.

TABLE 10

| Gas Flow Amount/min | SiH$_2$Cl$_2$/PH$_3$/H = 0.5 l/0.2 cc/100 l |
|---|---|
| Substrate Temperature | 1,000° C. |
| Pressure | Atmospheric pressure |
| Growth time | 1 min |

Figure 5C:
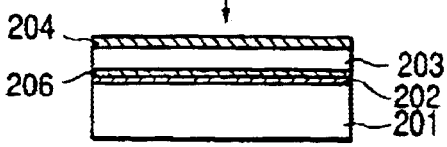
Figure 5H:
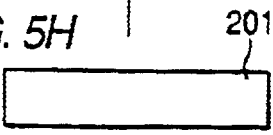

On the other hand, after the completion of growth, the inside of the vapor phase growth vessel 404 was replaced by hydrogen. In a liquid phase growth vessel 409, silicon was dissolved at 900° C. into a metal indium solvent within a boat 414 up to a concentration with which the solvent was just saturated, and stirred so that the solution was uniform. Upon the completion of adjustment of melting, a gate valve 410 was opened, and a substrate holder 416 was immersed into the melted material 415. Then cooling was gradually conducted at a cooling rate of –1° C./min. After 25 minutes, the gate valve 410 was opened and the substrate holder 416 was lifted up. Active layer having a thickness of 20 μm was deposited. The substrate holder 416 was received in the vapor phase growth vessel 404, and the gate valve 410 was closed. Here, the third P$^+$ type crystal silicone layer of 0.5 μm in thickness was deposited again by the vapor phase growth method under the condition shown in Table 11 (FIG. 5C).

TABLE 11

| Gas Flow Amount/min | SiH$_2$Cl$_2$/B$_2$H$_6$/H$_2$ = 1 l/0.5 cc/100 l |
|---|---|
| Substrate Temperature | 1,000° C. |
| Pressure | Atmospheric pressure |
| Growth time | 2 min |

Upon the completion of growth, hydrogen was allowed to flow to wait the cool down of the substrate holder 416. When the temperature of the substrate holder 416 was lowered to 200° C., the gate valve 405 was opened to transport the substrate holder 416 to the load lock chamber 401. After the door was closed, atmosphere inside thereof was replaced by nitrogen, and then the substrate holder 416 was taken out of the apparatus.

Figure 5D:
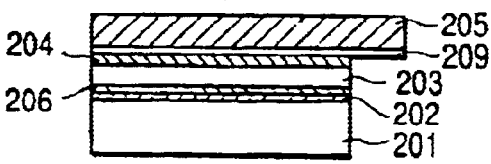

The copper paste was coated in thickness of 20 μm on one surface of the polyimide film having a thickness of 50 μm which was the second substrate by screen printing, and that surface was brought in close contact with and bonded to the surface of the above-mentioned wafer p$^+$ type thin-film silicon layer. In this state, it was conveyed into an oven so that the copper paste was sintered under the condition of 300° C. and 20 minutes, and the polyimide film and the wafer were bonded onto each other (FIG. 5D).

Figure 5E:
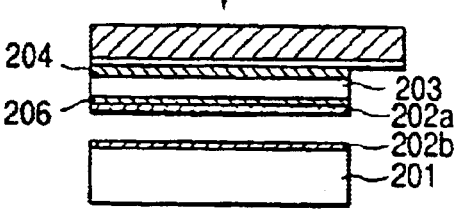

In the polyimide film and the wafer as bonded onto each other, another surface of the wafer which was not bonded was fixed by a vacuum chuck (not shown in the drawing), and a force was exerted from one end of the polyimide film to conduct peeling in such a manner that the n$^+$ type silicon layer, the active silicon layer and the p$^+$ type silicon layer were separated from the wafer and then transferred onto the polyimide film (FIG. 5E).

Figure 5F:
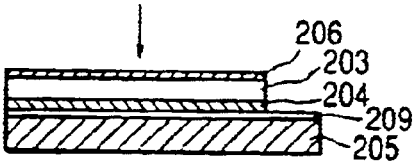

The remainder of the porous layer which remained on the thin-film silicon layer separated from the wafer was selectively etched while being stirred with a mixture solution consisting of hydrofluoric acid, hydrogen peroxide and pure water. The thin-film silicon layer remained without being etched, and only the remainder of the porous layer is completely removed (FIG. 5F). In the non-porous silicon single-crystal, the etching rate by using the above-mentioned etching solution is very low, and the selective ratio by the etching rate of porous silicon layer to that of non-porous silicon layer reaches 10$^5$ or more so that the etching amount of the porous layer (about several tens Å) can be ignored in practical use. As a result of observing the section of the layer by a transparent electron microscope, it has been recognized that excellent crystallinity is maintained such that a new crystal defect is not introduced in the thin-film silicon layer.

Figure 5G:
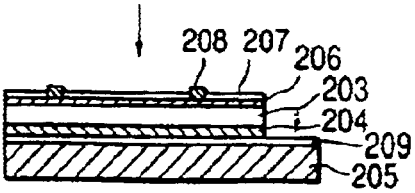

Finally, an ITO transparent conductive film (82 nm thick) and a collecting electrode (Ti/Pd/Ag (400 nm/200 nm/1 μm thick)) are formed on the n$^+$ type silicone layer by the EB (electron beam) vapor deposition to provide a solar cell (FIG. 5G).

As a result of measuring the I–V characteristic of the obtained polyimide thin-film/single-crystal silicon using solar cell thus under illumination of AM 1.5 (100 mW/cm$^2$) light, the conversion efficiency of 14.9% was obtained.

Also, the porous layer that remained on the silicon wafer as separated was removed by etching in the same manner as described above to produce a smooth surface (FIG. 5H). By using the regenerated wafer thus obtained, the above-mentioned steps were repeated to obtain a plurality of thin-film single-crystal solar cells having a semiconductor layer with high quality.

EXAMPLE 14

A solar cell was formed by the steps shown in FIGS. 12A to 12M, using an apparatus shown in FIG. 4.

First, a p$^+$ type region 1201 was formed in the surface of, as a substrate, B was thermally diffused onto the surface of the single-crystal silicon wafer having a thickness of 500 μm by using BCl$_3$ as the thermal diffusion source at a temperature of 1,200° C. to form a P$^+$ type layer, thus obtaining a diffusion layer of about 3 μm in depth.

Then, anodization was conducted under the same condition as in Example 13 in an HF solution to form a porous silicon layer 202 on the wafer (FIG. 12B).

Subsequently, the p⁺ type thin-film crystal silicon layer 206 was allowed to epitaxially grow under the same condition as in Example 13 by the vapor phase growth method (FIG. 12C).

Subsequently, similarly to Example 13, keeping the reducing atmosphere, the active layer 203 of a p⁻ type thin-film crystal silicon was allowed to epitaxially grow by the liquid phase growth method (FIG. 12D).

Again, the n⁺ type thin-film crystal silicon layer 204 was allowed to epitaxially grow under the same condition as in Example 13 by the vapor phase growth method (FIG. 12E).

At this stage, the wafer was taken out of the apparatus shown in FIG. 4, an ITO transparent electrode 706 was deposited through the commercially available sputtering apparatus (FIG. 12F).

Keeping the state, a water-soluble adhesive 707 for book binding (AGX-5137 manufactured by Nitta Gelatine Co.) was coated on the surface, and a water permeable substrate such as a commercially available cardboard 708 (the second substrate) was bonded thereonto and dried (FIG. 12G).

In this state, the silicon wafer 201 was vacuum chucked and a force was exerted on the cardboard 708. As a result, the porous layer 202 was destroyed and the semiconductor layer together with the cardboard 708 was peeled off from the wafer 201 (FIG. 12H).

The sample peeled off was then bonded onto a stainless steel plate 710 (the third substrate) coated with a copper paste 709, and was provisionally sintered at 150° C. (FIG. 12I). Thereafter, hot water at 80° C. was made to permeate from the back of the cardboard 708 to thereby dissolve the adhesive 707 and peel off the semiconductor layer from the cardboard 708 (FIG. 12J).

Thereafter, remainder of the adhesive 707 which remained on the surface of the transparent electrode 706 was washed, and further a collecting electrode 711 was printed on the surface of the semiconductor layer with a copper paste. After conducting a provisional sintering, it was fully sintered at 500° C. (FIG. 12K). Copper has a high reflectance with respect to sun light which penetrates the semiconductor layer without being absorbed, thereby being capable of absorbing the light again by the semiconductor layer. Accordingly, even in the solar cell using a relatively thin semiconductor layer, high efficiency can be obtained.

Further, in the step as shown in FIG. 12H, the porous layer 202 which remained after peeling off is not necessarily removed, because it does not cause a functional obstacle which is a feature of this structure.

On the other hand, the remainder of the porous layer 702 that remained on the wafer 201 as separated in the step shown in FIG. 12H was removed by etching to produce a smooth surface (FIG. 12L). Thereafter, the p⁺type layer 1201' of about 3 μm in thickness was again formed by the liquid phase growth method (FIG. 13M). The above steps were repeated again using the silicone wafer 201, the solar cell was fabricated.

As a result of measuring the I–V characteristic of the obtained thin-film single-crystal silicon solar cell using the stainless plate under illumination of AM 1.5 (100 mW/cm²) light, the energy conversion efficiency of 15% or more was obtained with respect to the solar cells obtained by either the first or second cycle.

Further, according to the present invention, not only the method in which adhesive force is lowered by permeating water, but also another means of, for example, containing solvents, or any means that can lower the adhesive force may be applied to obtain the same functional effect.

EXAMPLE 15

A solar cell was formed in the same manner as in Example 14 by the steps shown in FIGS. 12A to 12M except that the doping was not carried out on the semiconductor layer 206 grown on the porous layer 202 in vapor phase. Further, when the active layer 203 was grown, the growth of silicone was terminated. In the vapor phase growth vessel 404 shown in FIG. 4, the surface of the silicon layer was heat treated at 1,200° C. for one hour by the vapor phase diffusion method using POC₃ to thermally diffuse P in the vicinity of the surface of silicon. As a result, n⁺ type layer 204 was formed. At the same time, B in the P⁺ type porous layer was thermally diffused. As a result, the semiconductor layer 206 became P⁺ type.

Thereafter, the solar cell was formed in the same procedure as in Example 14 after the formation of the transparent electrode 706 (FIG. 12F). Further, the wafer used was subjected to the same treatment and was reused, thereby being capable of fabricating the solar cell, newly.

As a result of measuring the I–V characteristic of the obtained thin-film single-crystal silicon solar cell on the stainless plate under illumination of AM 1.5 (100 mW/cm²) light, the energy conversion efficiency of 15% or more was obtained with respect to the solar cells obtained by either the first or second cycle.

EXAMPLE 16

In this example, a stagger type field effect transistor is fabricated inh the same manner as in Example 13.

In the same manner as in Example 13, B was thermally diffused into the surface of single-crystal silicon wafer 601 having a thickness of 500 μm by using BCl₃ as a heat diffusion source at a temperature of 1,200° C. to form a p⁺ type layer and obtain a diffusion layer of about 3 μm in thickness. Then, a porous layer 802 was formed in the same manner in Example 1 (FIGS. 10A and 10B).

Subsequently, sample was set on the apparatus shown in FIG. 4. Firstly, in the vapor phase vessel 404, an n⁺ type thin-film silicon layer 603 having a thickness of 0.1 μm was deposited on the porous layer 602 (FIG. 10C).

Then, keeping the reducing atmosphere, the sample was transported into the liquid phase growth vessel to deposit a P⁻ type thin-film silicon layer 604 was deposited, and then lifted up from the apparatus shown in FIG. 4 (FIG. 10D).

Subsequently, the surface side of the p⁻ type thin-film silicon layer 604 was oxidized to 0.1 μm in depth by the heat treatment in a steam to provide a gate insulated film 605 (FIG. 10E).

On the film, an aluminum film was deposited by the sputtering method, and a gate electrode/gate wiring 606 was formed by the photolithography process (FIG. 10F). On the film, the glass substrate 608 was stuck through the SiO₂ film 607 by the sol/gel method (FIG. 10G).

Thereafter, the wafer 601 was peeled off, and after the remainder of the porous layer 602 was removed (FIG. 10I), the n⁺ type thin-film silicon layer 603 was patterned as indicated by reference numeral 603' and 603" by the photolithography process. Moreover on the film, a silicon nitride layer was deposited, and patterned by the photolithography process as indicated by reference numeral 609. Furthermore, an aluminum layer was deposited and patterned by the photolithography process, to thereby form the drain electrode/drain wiring 610' and the source electrode/source wiring 610" (FIGS. 10H to 10L).

Since the transistor thus fabricated had p⁻ type layer of single-crystal and was thinned, it obtained very high on/off ratio of the drain current than the on/off ratio of the gate voltage, and also obtained large on current. Therefore, even if the area of the transistor is small, a large driving performance is provided. Also, since it is of the stagger type using single-crystal, the degree of free of the drain/gate wiring is as large as that of the transistor using amorphous silicon, and when the transistor is used for the matrix driving of liquid crystal or the like, the high contrast, the high-speed operation and the high opening degree can be readily realized.

As was described above, according to the present invention, the semiconductor layer made of single-crystal which is excellent in crystallinity, polycrystal or the like, can be produced on the second substrate at the low costs. Also, the semiconductor member which can be variously used can be obtained by forming the semiconductor layer on the inexpensive and flexible substrate.

Also, according to the present invention, the thin-film crystal solar cell with high conversion efficiency can be obtained on the low-heat-resistant substrate, thereby being capable of providing the solar cells with excellent mass production and high quality to the market.

Also, according to the present invention, there can be provided a method of producing a semiconductor member in which crystal semiconductor excellent in various characteristics can be formed even on a substrate which is not high-temperature resistant and a method of producing a solar cell using the semiconductor member.

Further, according to the present invention, there can be provided a method of producing a semiconductor member in which crystal semiconductor excellent in various characteristics can be formed even on a flexible substrate and a method of producing a solar cell using the semiconductor member.

Further, according to the present invention, there can be provided a method of producing a semiconductor member which can be variously applied, used and arranged and a method of producing a solar cell using the semiconductor member.

Further, according to the present invention, there can be provided a method of producing a semiconductor member having excellent semiconductor characteristics at low costs and a method of producing at low costs a solar cell and exhibiting various characteristics such as excellent photo-electric conversion characteristics or use characteristics by using the semiconductor member.

Further, according to the present invention, there can be provided a method of producing a solar cell which can exhibit high conversion efficiency.

Further, according to the present invention, there can be provided a semiconductor member which can be obtained by peeling off an epitaxial layer formed on a crystal substrate from the crystal substrate and the crystal substrate to be reused, and a semiconductor member with more high performance which is produced at low costs by use of an inexpensive raw material.

Further, according to the present invention, there can be provided a solar cell which is formed by using a semiconductor member and the crystal substrate to be reused, and a semiconductor member with more high performance and which is produced at low costs by use of an inexpensive raw material.

Also, as was described above, according to the present invention, the thin semiconductor layer is allowed to grow on the single-crystal substrate by the vapor phase growth method in which the crystal growth is readily controlled, and the conveying conditions are strictly controlled. Sequentially, the crystal semiconductor layer having the least thickness necessary for absorbing a solar light can be allowed to epitaxially grow by the liquid phase method which is reduced in the raw material costs before being separated, and the expensive substrate can be repeated used, thereby being capable of providing a flexible solar cell with high efficiency at low costs.

Further, since the reducing atmosphere is always maintained, the thin-film semiconductor layer having a high-quality joint can be readily obtained.

Further, the polycrystal substrate or the substrate with high impurity concentration can be also used as the substrate, thereby being capable of more reducing the costs.

Further, the thin-film crystal solar cell with high conversion efficiency can be obtained on the low-heat-resistant substrate, thereby being capable of providing the solar cells with excellent mass production and high quality to the market. Further, in order to compensate a reduction of the thickness of the first substrate which is accompanyed by the formation and separation of the porous layer, the crystal layer is allowed to grow on the surface of the first substrate by the liquid phase growth method, thereby being capable of effectively utilizing the first substrate and also optimizing the porous layer without being directly affected by the quality of the substrate.

Further, there can be obtained the transistor which is excellent in characteristics so as to provide a large driving performance even though the area of the transistor is small, in the case of preparing the transistor by using the method of producing the semiconductor member according to the present invention. Also, since the stagger type field effect transistor using the above-mentioned single-crystal as described in the above Examples can be readily fabricated, the degree of free of the drain/gate wiring is increased as much as the transistor using amorphous silicon. In the case of using the transistor for liquid-crystal matrix drive, etc., high contrast, high-speed operation and high opening ratio can be readily realized.

In addition, by using the semiconductor member obtained according to the method of the present invention, semiconductor devices such as an LED (Light Emitting Device) other than the transistor and the solar cell can be formed on a flexible substrate or an insulating substrate. The semiconductor member of the present invention is a so-called SOI (semiconductor on insulator) having the semiconductor layer excellent in various characteristics, and is very usuful.

What is claimed is:

1. A method of producing a solar cell comprising the steps of:

forming a porous layer in a surface region of a first substrate;

forming a first semiconductor layer on the porous layer by liquid phase epitaxy under a reducing atmosphere;

forming a second semiconductor layer on the first semiconductor layer by liquid phase epitaxy;

bonding the first substrate to a second substrate to obtain a multiple layer structure with the second semiconductor layer positioned inside; and separating the first substrate from the multiple layer structure by utilizing the porous layer to transfer the first and second semiconductor layers to the second substrate;

wherein in the liquid phase epitaxy used to form the first semiconductor layer, a melting solution in which elements for forming the first semiconductor layer are dissolved up to a desired concentration, which is the same as or below saturated concentration, is brought into contact with a surface of the porous layer which is annealed under a reducing atmosphere in advance, while a surface temperature of the porous layer is made lower than a temperature at which elements in the melting solution having the desired concentration are saturated by at least 5 degrees Celsius.

2. A method according to claim 1, further comprising a step of removing the porous layer remaining on the surface of the first substrate after the first substrate is separated from the transferred semiconductor layers.

3. A method according to claim 1, wherein the bonding step of the second substrate is conducted using an adhesive.

4. A method according to claim 3, wherein the adhesive includes a water-soluble adhesive.

5. A method according to claim 1, further comprising a step of separating the second substrate to transfer the semiconductor layers onto a third substrate.

6. A method according to claim 1, wherein the second substrate has a water permeability.

7. A method according to claim 5, wherein the separation of the second substrate is conducted by the deterioration of adhesion of the adhesive used for bonding of the second substrate.

8. A method according to claim 7, wherein the deterioration of the adhesion is conducted by a liquid that has passed through the second substrate.

9. A method according to claim 7, wherein the adhesive is water-soluble, and the deterioration of the adhesion is conducted by a water that permeates the second substrate.

10. A method according to claim 1, wherein an impurity in the porous layer is diffused into the first semiconductor layer.

11. A method according to claim 1, wherein the liquid phase epitaxy for forming the first semiconductor layer is conducted with indium as a solvent.

12. A method according to claim 1, wherein before the bonding of the second substrate, an impurity is introduced into one or both the semiconductor layers.

13. A method according to claim 1, wherein before the bonding of the second substrate, an impurity is introduced into one or both of the semiconductor layers to form a p-n junction.

14. A method according to claim 1, wherein the second substrate has an electroconductive surface.

15. A method according to claim 1, further comprising a step of removing the porous layer remaining on the transferred first semiconductor layer.

16. A method according to claim 1, further comprising a step of forming an electrode on the transferred semiconductor layers.

17. A method according to claim 1, further comprising a step of introducing an impurity into one or both of the transferred semiconductor layers.

18. A method according to claim 1, further comprising a step of forming a semiconductor layer containing an impurity on the transferred semiconductor layers.

19. A method of producing a semiconductor member comprising the steps of:

(a) forming a porous layer in a surface region of a first substrate;

(b-1) immersing, into a melting solution in which elements for forming a first semiconductor layer to be grown are dissolved up to a desired concentration, which is the same as or below saturated concentration, the porous layer, whose surface temperature is made lower than a temperature at which the melting solution having the desired concentration is saturated by at least 5 degrees Celsius, under a reducing atmosphere to grow the first semiconductor layer on a surface of the porous layer, (b-2) forming a second semiconductor layer on the first semiconductor layer by liquid phase epitaxy;

(c) bonding a second substrate onto a surface side of the first substrate on which at least the porous layer and the first semiconductor layer are formed; and (d) separating the first substrate from the second substrate at the porous layer to transfer the first and second semiconductor layers separated from the first substrate to the second substrate.

20. A method of producing a semiconductor member according to claim 19, wherein a surface of the first substrate separated in the step (d) is treated and then again subjected to the step (a) as the first substrate.

21. A method of producing a semiconductor member according to claim 20, wherein after the surface of the first substrate separated in the step (d) is treated and before it is again subjected to the step (a), a semiconductor layer into which an impurity is introduced by liquid phase growth is allowed to grow on the surface of the first substrate.

22. A method of producing a semiconductor member according to claim 21, wherein after the surface of the first substrate in the step (d) is treated and prior to the growth of the semiconductor layer into which the impurity is introduced, a semiconductor layer into which no impurity is introduced or into which an impurity is introduced with a small concentration is formed on the surface of the first substrate.

23. A method of producing a semiconductor member according to claim 21, wherein a semiconductor having a purity of 99.99% or less is used as the first substrate.

24. A method of producing a semiconductor member according to claim 19, wherein the first substrate is crystalline.

25. A method of producing a semiconductor member according to claim 19, wherein the first substrate is made of silicon single-crystal.

26. A method of producing a solar cell, comprising a step of using the semiconductor layers transferred to the second substrate which are obtained by the method of claim 19.

* * * * *